United States Patent
Yang et al.

(10) Patent No.: US 12,176,336 B2
(45) Date of Patent: Dec. 24, 2024

(54) METHOD OF PICKING UP DIE AND METHOD OF MANUFACTURING SEMICONDUCTOR PACKAGE USING THE SAME

(71) Applicant: Samsung Electronics Co., Ltd., Suwon-si (KR)

(72) Inventors: Mi-Jeong Yang, Cheonan-si (KR); Youngseok Jung, Seoul (KR); Jinsung Jung, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 423 days.

(21) Appl. No.: 17/728,462

(22) Filed: Apr. 25, 2022

(65) Prior Publication Data

US 2023/0065487 A1 Mar. 2, 2023

(30) Foreign Application Priority Data

Aug. 27, 2021 (KR) .................. 10-2021-0114267

(51) Int. Cl.
*H01L 21/677* (2006.01)
*H01L 25/00* (2006.01)

(52) U.S. Cl.
CPC .................. *H01L 25/50* (2013.01)

(58) Field of Classification Search
CPC ................ H01L 25/50; H01L 25/0657
See application file for complete search history.

(56) References Cited

U.S. PATENT DOCUMENTS

| | | | | |
|---|---|---|---|---|
| 2021/0020483 A1* | 1/2021 | Jung | ................ | H01L 21/67132 |
| 2022/0367383 A1* | 11/2022 | Wang | ................ | H01L 25/16 |
| 2022/0406627 A1* | 12/2022 | Chen | ................ | H01L 21/67115 |
| 2023/0005782 A1* | 1/2023 | Yamanaka | ................ | C09J 7/38 |
| 2023/0245996 A1* | 8/2023 | Sreenivasan | ........ | H01L 25/0657 438/15 |
| 2024/0128098 A1* | 4/2024 | Kim | ................ | B65G 47/90 |

FOREIGN PATENT DOCUMENTS

| | | |
|---|---|---|
| JP | 2008-134794 A | 6/2008 |
| JP | 2013-004794 A | 1/2013 |
| JP | 5797492 B2 | 10/2015 |
| KR | 10-1780359 B1 | 9/2017 |
| KR | 10-2037967 B1 | 10/2019 |

\* cited by examiner

*Primary Examiner* — Thao P Le
(74) *Attorney, Agent, or Firm* — Harness, Dickey & Pierce, P.L.C.

(57) ABSTRACT

A method of picking up a die may include classifying a pickup region of a diced wafer, in which targeted pickup dies are placed, into first to n-th regions and performing a pickup step on dies in the first to n-th regions. The first region may include first dies, which are outermost dies of the targeted pickup dies. An (x+1)-th region may include regions, occupied by dies adjacent to at least one of x-th dies in an x-th region and proximate to a center of the pickup region in relation to the x-th region, n may be a natural number, and x may be an arbitrary natural number that is smaller than the n. The n-th region may have a rectangular shape, and a quantity of n-th dies in the n-th region in contact with a short side of the n-th region may be one or two.

16 Claims, 27 Drawing Sheets

METHOD OF PICKING UP DIE AND METHOD OF MANUFACTURING SEMICONDUCTOR PACKAGE USING THE SAME

CROSS-REFERENCE TO RELATED APPLICATIONS

This U.S. non-provisional patent application claims priority under 35 U.S.C. § 119 to Korean Patent Application No. 10-2021-0114267, filed on Aug. 27, 2021 in the Korean Intellectual Property Office, the entire contents of which are hereby incorporated by reference.

BACKGROUND

The present inventive concepts relate to methods of picking up a die and methods of manufacturing a semiconductor package using the same.

Semiconductor devices are fabricated by various processes. For example, a semiconductor device may be fabricated by performing a photolithography process, an etching process, and a deposition process on a silicon wafer. Thereafter, the wafer may be diced into a plurality of dies. Each of the dies may be picked up from the diced wafer and may be stacked on a substrate. A plurality of the dies may be stacked on each substrate.

SUMMARY

Some example embodiments of the inventive concepts provide a die pickup method capable of improving a yield in a process of manufacturing a semiconductor package and a method of manufacturing a semiconductor package using the same.

Some example embodiments of the inventive concepts provide a die pickup method capable of collectively stacking dies, which are disposed in a region having a high failure rate, on a substrate, and a method of manufacturing a semiconductor package using the same.

According to some example embodiments of the inventive concepts, a method of picking up a die may include classifying a pickup region of a diced wafer, in which targeted pickup dies are placed, into first to n-th regions and performing a pickup step on dies in the first to n-th regions. The first region may be a region provided with first dies, which are the outermost dies of the targeted pickup dies. An (x+1)-th region may include regions, which are occupied by dies adjacent to at least one of x-th dies in an x-th region, wherein the (x+1)-th region is proximate to a center of the pickup region in relation to the x-th region, wherein n is a natural number, and the x may be an arbitrary natural number that is smaller than the n. The n-th region may have a rectangular shape, and among n-th dies in the n-th region, a quantity of the n-th dies in contact with a short side of the n-th region may be 1 or 2. The performing the pickup step on dies in the first to n-th regions may include performing the pickup step on (x+1)-th dies in the (x+1)-th region subsequently to finishing performing the pickup step on all of the x-th dies in the x-th region.

According to some example embodiments of the inventive concepts, a method of picking up a die may include classifying a pickup region of a diced wafer, in which targeted pickup dies are placed, into first to n-th regions and performing a pickup step on dies in the first to n-th regions. The first region may be a region provided with first dies, which are the outermost dies of the targeted pickup dies. An (x+1)-th region may include regions, which are occupied by dies adjacent to at least one of x-th dies in an x-th region, wherein the (x+1)-th region is proximate to a center of the pickup region in relation to the x-th region, wherein n is a natural number, and the x may be an arbitrary natural number that is smaller than the n. The n-th region may have a rectangular shape, and among n-th dies in the n-th region, a quantity of the n-th dies in contact with a short side of the n-th region may be 1 or 2. The performing the pickup step on dies in the first to n-th regions may include performing the pickup step on the x-th dies subsequently to finishing performing the pickup step on all of (x+1)-th dies in the (x+1)-th region.

According to some example embodiments of the inventive concepts, a method of picking up a die may include classifying a pickup region of a diced wafer, in which targeted pickup dies are placed, into a first region and a remaining region and performing a pickup step on dies in the first region and the remaining region one by one. The first region may be a region provided with first dies, each of which has at least one side exposed to an outside of the pickup region. The remaining region may be a region provided with inner dies, wherein the remaining region is proximate to a center of the pickup region in relation to the first region. The performing the pickup step on the dies in the first region and the remaining region one by one may include picking up the first dies and picking up the inner dies. The picking up of the inner dies may include sequentially picking up the inner dies one by one along a zigzag trajectory. Until the pickup step on one group of groups of the first dies and the inner dies is finished, the pickup step may not be performed on another group of groups of the first dies and the inner dies.

According to some example embodiments of the inventive concepts, a method of picking up a die may include classifying a pickup region of a diced wafer, in which targeted pickup dies are placed, into a first region, a second region, and a remaining region and picking up dies in the first region, the second region, and the remaining region one by one. The first region may be a region provided with first dies, each of which has at least one side exposed to an outside of the pickup region. The second region may be a region provided with second dies that are adjacent to at least one of the first dies. The remaining region may be a region provided with inner dies wherein the remaining region is proximate to a center of the pickup region in relation to the second region. The picking up of the dies one by one may include picking up the first dies, picking up the second dies, and picking up the inner dies. The picking up of the inner dies may include sequentially picking up the inner dies one by one along a zigzag trajectory. The picking up of the first dies and the picking up of the second dies may not be overlapped with the picking up of the inner dies in time.

According to some example embodiments of the inventive concepts, a method of manufacturing a semiconductor package may include classifying a pickup region of a diced wafer, in which targeted pickup dies are placed, into a first region and a second region and performing a pickup step on dies in the first region and the second region. The first region may include an edge region and a center region. The edge region may be a region provided with first dies, each of which has at least one side exposed to an outside of the pickup region, and the center region may be a region including a center of the diced wafer. The second region may be placed between the edge region and the center region. The pickup step on the dies may include picking up first dies in the first region and picking up second dies in the second region. Until the pickup step on one group of groups of the first dies and the second dies is finished, the pickup step may be not performed on another group of groups of the first dies and the second dies.

DETAILED DESCRIPTION

Figure 1:
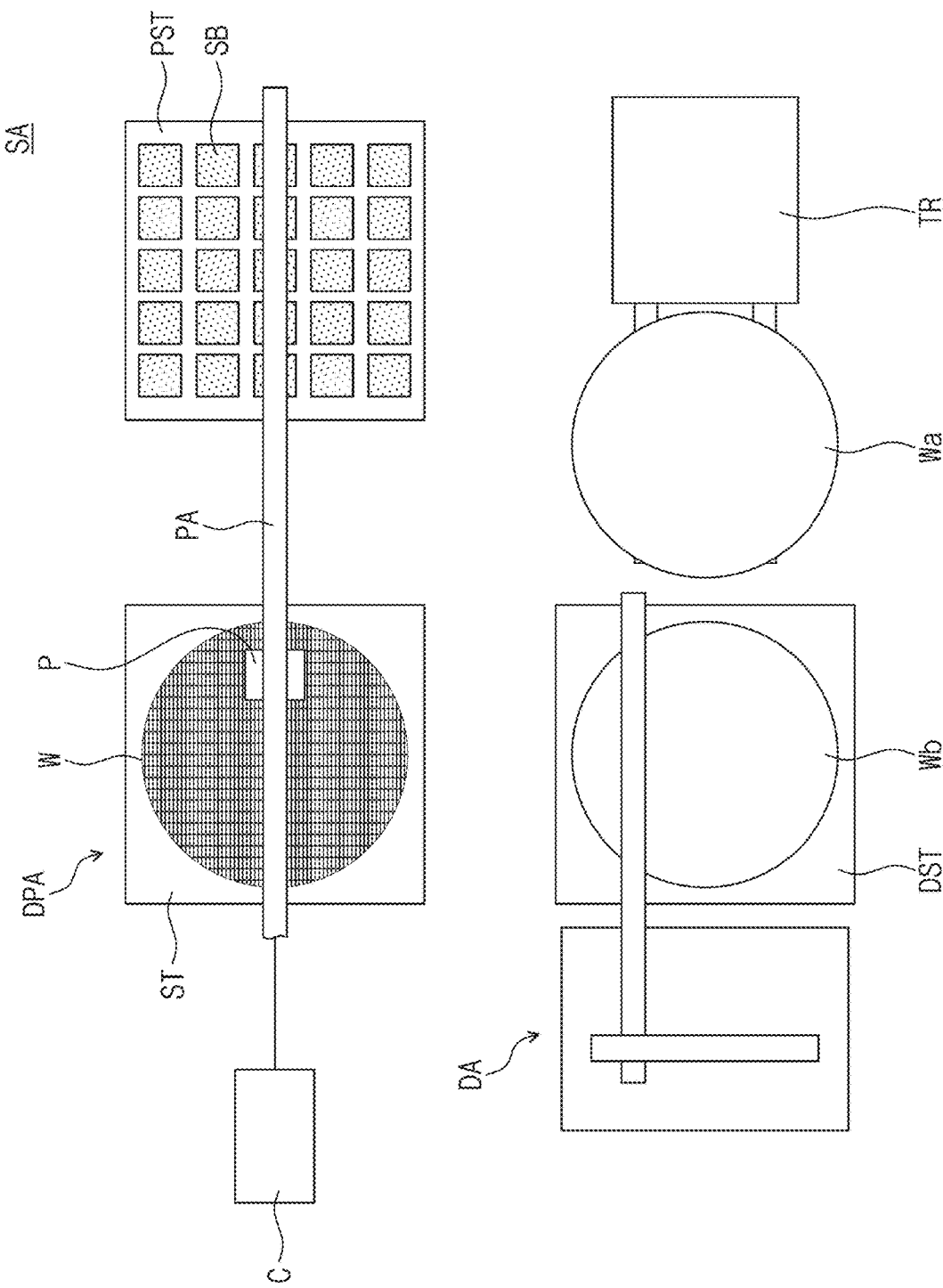
FIG. 1 is a plan view illustrating a system of manufacturing a semiconductor package, according to some example embodiments of the inventive concepts.

Example embodiments of the inventive concepts will now be described more fully with reference to the accompanying drawings, in which example embodiments are shown. Like reference numerals in the drawings denote like elements, and thus their description will be omitted.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 is a plan view illustrating a system of manufacturing a semiconductor package, according to some example embodiments of the inventive concepts.

Referring to FIG. 1, a semiconductor package manufacturing system SA may be provided. The semiconductor package manufacturing system SA may be a system that is used to manufacture a semiconductor package, in which a semiconductor chip is stacked on a substrate. In the present specification, the term 'substrate' may be or include a printed circuit board (PCB), a redistribution-layer (RDL) substrate, or the like. The semiconductor package manufacturing system SA may be used to pick up a die from a wafer, on which various processes have been performed, and to place the die on the substrate. For this, the semiconductor package manufacturing system SA may include a dicing apparatus DA, a transfer apparatus TR, and a die pickup apparatus DPA.

The dicing apparatus DA may be used to cut a wafer Wb. In other words, the dicing apparatus DA may be configured to cut the wafer Wb, which is disposed on a dicing stage DST, into a plurality of dies. A diced wafer W may be transferred to the die pickup apparatus DPA. The dicing apparatus DA may be configured to cut the wafer Wb in various manners. For example, the dicing apparatus DA may cut the wafer Wb using a laser dicing method, a blade dicing method, or a plasma dicing method.

The transfer apparatus TR may be used to transfer a wafer Wa. For example, the transfer apparatus TR may be used to transfer the wafer Wa, on which various processes have been performed, to the dicing apparatus DA.

The die pickup apparatus DPA may be used to pick up each die from the diced wafer W and to stack the die on a substrate. In other words, the die pickup apparatus DPA may mean a pick-and-place apparatus. The die pickup apparatus DPA may include a stage ST, a die picker P, a picker driving part PA, a packaging stage PST, and a control unit C.

The stage ST may be configured to support the diced wafer W. That is, the diced wafer W, which is diced by the dicing apparatus DA, may be disposed on the stage ST. The stage ST may be movable. More specifically, the stage ST, on which the diced wafer W is disposed, may be configured to translate in a horizontal direction. The die picker P may be configured to reciprocate only within a certain region and to pick up the die at a fixed position. Since the stage ST itself moves, a position of a descending motion of the die picker P on a wafer W may be changed. However, the inventive concepts are not limited to this example, and in some example embodiments, the stage ST may be fixed to a specific position. The stage ST will be described in more detail with reference to FIG. 2.

The die picker P may pick up each die from the diced wafer W. The die picker P may pick up a die in various manners. For example, the die picker P may pick up a die in a vacuum suction manner. The die picker P may be moved along the picker driving part PA. After the pickup of the die from the diced wafer W, the die picker P may be moved to a region on the packaging stage PST by the picker driving part PA. The die picker P may place on the picked-up die on a substrate SB which is loaded on the packaging stage PST.

The picker driving part PA may be configured to move the die picker P. More specifically, the picker driving part PA may move the die picker P, which has a die that is picked up from the stage ST, to the packaging stage PST. In some example embodiments, the picker driving part PA may be used to move the die picker P, which is placed on the packaging stage PST, to the stage ST. The semiconductor package may be manufactured by repeating a process of stacking a die, which is picked up from the diced wafer W by the die picker P, on the substrate SB. The die picker P is illustrated as a single component, but the inventive concepts are not limited to this example. For example, two or more die pickers P may be provided on the single stage ST. The die pickers P may be configured to pick up the die alternately one by one from the diced wafer W disposed on the single stage ST. However, for convenience in description, the die picker P will be described as a single component, unless otherwise stated.

The packaging stage PST may be configured to support the substrate SB. A semiconductor package may be manufactured by stacking a die on the substrate SB, which is disposed on the packaging stage PST. In some example embodiments, a plurality of substrates SB may be disposed on the single packaging stage PST. The packaging stage PST may be configured to be movable, similar to the stage ST. More specifically, the packaging stage PST, on which the substrates SB are disposed, may be configured to translate in a horizontal direction. The die picker P may be configured to reciprocate only within a certain region and to descend the die at a fixed position. Here, since the packaging stage PST itself is movable, it may be possible to place a die, which is descended by the die picker P, on various positions, not on a fixed one of the substrates SB. However, the inventive concepts are not limited to this example, and in some example embodiments, the packaging stage PST may be fixed to a certain position.

The control unit C may be configured to control the stage ST, the die picker P, the picker driving part PA, and the packaging stage PST. For this, the control unit C may include a memory and a processor. The memory may be an IC chip, which is configured to store a program, an instruction, and a data for operations of the stage ST, the die picker P, the picker driving part PA, and/or the packaging stage PST. For example, the memory of the control unit C may store a program about the order of dies to be sequentially picked up from the diced wafer W. The stage ST, the die picker P, the picker driving part PA, and/or the packaging stage PST may be operated in accordance with information on the die pickup order stored in the memory. For example, the stage ST may be orderly moved in the die pickup order. In some example embodiments, the die picker P may be moved in accordance with the die pickup order to orderly pick up a die. The processor may generate control signals, which are used to control the stage ST, the die picker P, the picker driving part PA, and/or the packaging stage PST, based on a program, an instruction, and a data stored in the memory. For example, the processor may control the operations of the stage ST, the die picker P, the picker driving part PA and/or the packaging stage PST in accordance with the information on the die pickup order stored in the memory. The control unit C may be provided in the form of an additional computer. In some example embodiments, the control unit C may be provided to have a structure that is coupled to the stage ST, the die picker P, the picker driving part PA, and/or the packaging stage PST.

Figure 2:
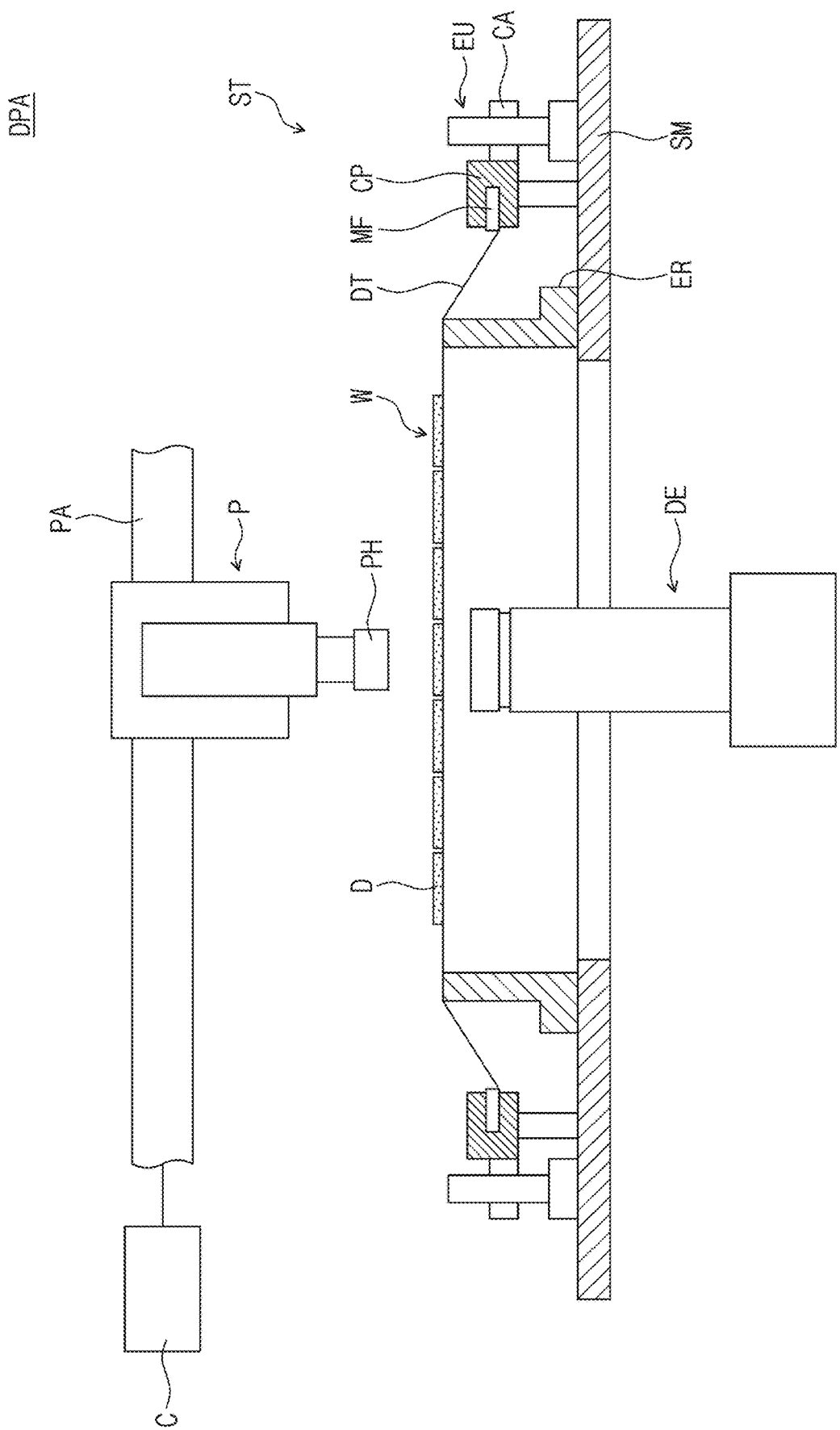
FIG. 2 is a side view illustrating a portion of a system of manufacturing a semiconductor package, according to some example embodiments of the inventive concepts.

FIG. 2 is a side view illustrating a portion of a system of manufacturing a semiconductor package, according to some example embodiments of the inventive concepts.

Referring to FIG. 2, the diced wafer W may be divided into a plurality of dies D. The wafer W, which is divided into the plurality of dies D, may be disposed on a dicing tape DT. In other words, the wafer W, which is diced by the dicing apparatus DA (e.g., see FIG. 1), may be transferred to a region on the stage ST while being disposed on the dicing tape DT. The stage ST may include a supporting part SM, an expansion ring ER, an expansion unit EU, and a die ejector DE.

The supporting part SM may be configured to support the wafer W. The expansion ring ER and the expansion unit EU may be disposed on the supporting part SM. The supporting part SM may be provided in the form of a hollow ring.

The expansion ring ER may be placed on the supporting part SM. The expansion ring ER may be provided in the form of a hollow cylinder. The expansion ring ER may be configured to support the dicing tape DT. In other words, the dicing tape DT, on which the diced wafer W is disposed, may be disposed on the expansion ring ER.

The expansion unit EU may be placed on the supporting part SM. The expansion unit EU may include a mount frame MF, a clamp CP, and a clamp driving part CA. The mount frame MF may be configured to fasten the dicing tape DT. In other words, an outer rim of the dicing tape DT, on which the diced wafer W is disposed, may be fastened by the mount frame MF. The clamp CP may be configured to grasp the mount frame MF. The clamp driving part CA may be configured to drive the mount frame MF and the clamp CP. For this, the clamp driving part CA may include a motor or the like. The clamp driving part CA may be configured to move the mount frame MF and the clamp CP in a vertical direction. In some example embodiments, the clamp driving part CA may be configured to move the mount frame MF and the clamp CP in a horizontal direction. In this case, the dicing tape DT may be deformed. For example, if the mount frame MF is descended, the dicing tape DT may be stretched out in its radial direction. If the dicing tape DT is stretched out in its radial direction, the diced wafer W disposed on the dicing tape DT may be expanded. For example, a distance between the dies D in the diced wafer W (e.g., a distance between dies in the first and second regions as described herein) may be increased.

The die ejector DE may be placed below the dicing tape DT. The die ejector DE may be configured to be movable in an upward/downward direction. If the die ejector DE ascends, it may exert pressure on a portion of the dicing tape DT in an upward direction. As a result, an upward force may be exerted on a die D on the dicing tape DT.

The die picker P may pick up the die D from the expanded wafer W. The die picker P may include a picker head PH that is configured to pick up a single die D. As described above, the picker head PH may pick up the die D in various manners. For example, the picker head PH may pick up the die D in a vacuum suction manner. When the die D is picked up by the picker head PH, the die ejector DE may be moved in the upward direction to exert a force on the die D to be picked up in the upward direction. Since the upward force is exerted on the die D, the die D may be easily suctioned by the picker head PH. The die picker P, by which the die D is picked up, may be moved to a region on the packaging stage PST (e.g., see FIG. 1) along the picker driving part PA.

The operation of picking up the die D from the diced wafer W may be sequentially performed on each die one by one. A pickup order of the die D may be stored in the memory of the control unit C, as described above. According to the pickup order of the die D, the stage ST may be moved or the descending position of the die picker P may be changed. Hereinafter, a method of picking up a die using the semiconductor package manufacturing system SA (e.g., see FIG. 1) and a method of manufacturing a semiconductor package using the same will be described in more detail with reference to FIG. 3A or the like.

Figure 3A:
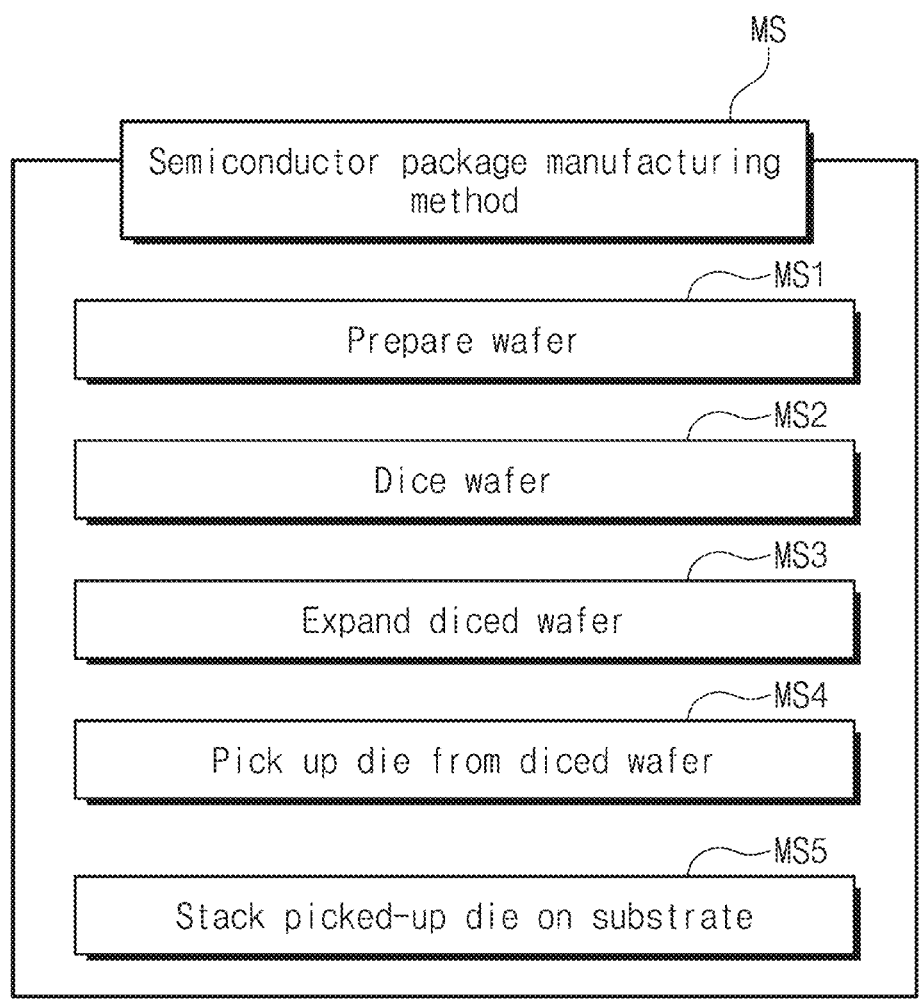
FIG. 3A is a flow chart illustrating a method of manufacturing a semiconductor package, according to some example embodiments of the inventive concepts.

FIG. 3A is a flow chart illustrating a method of manufacturing a semiconductor package, according to some example embodiments of the inventive concepts. The method shown in FIG. 3A, and the methods according to any of the example embodiments, may be implemented, in part or in fully, by the semiconductor package manufacturing system SA of FIG. 1 or any part thereof.

Referring to FIG. 3A, a semiconductor package manufacturing method MS may be provided. In the semiconductor package manufacturing method MS, the semiconductor package manufacturing system SA of FIG. 1 may be used to manufacture a semiconductor package. The semiconductor package manufacturing method MS may include preparing a wafer (in MS1), dicing the wafer (in MS2), expanding the diced wafer (in MS3), picking up a die (e.g., one or more dies) from the diced wafer (in MS4), and stacking the picked-up die (e.g., the one or more dies picked up based on performing the pickup step at MS4) on a substrate (in MS5).

The picking up of the die from the diced wafer (in MS4) and the stacking of the picked-up die on the substrate (in MS5) may be repeated several times. The picking up of the die from the diced wafer (in MS4) and the stacking of the picked-up die on the substrate (in MS5) may be performed in an alternating manner. For example, the picking up of the die from the diced wafer (in MS4) may be performed once, the stacking of the picked-up die on the substrate (in MS5) may be performed, and then, the picking up of the die from the diced wafer (in MS4) may be performed again. Thereafter, the stacking of the picked-up die on the substrate (in MS5) may be performed again.

The picking up of the die from the diced wafer (in MS4) may be performed through a die pickup method. This will be described with reference to FIG. 3B.

Figure 3B:
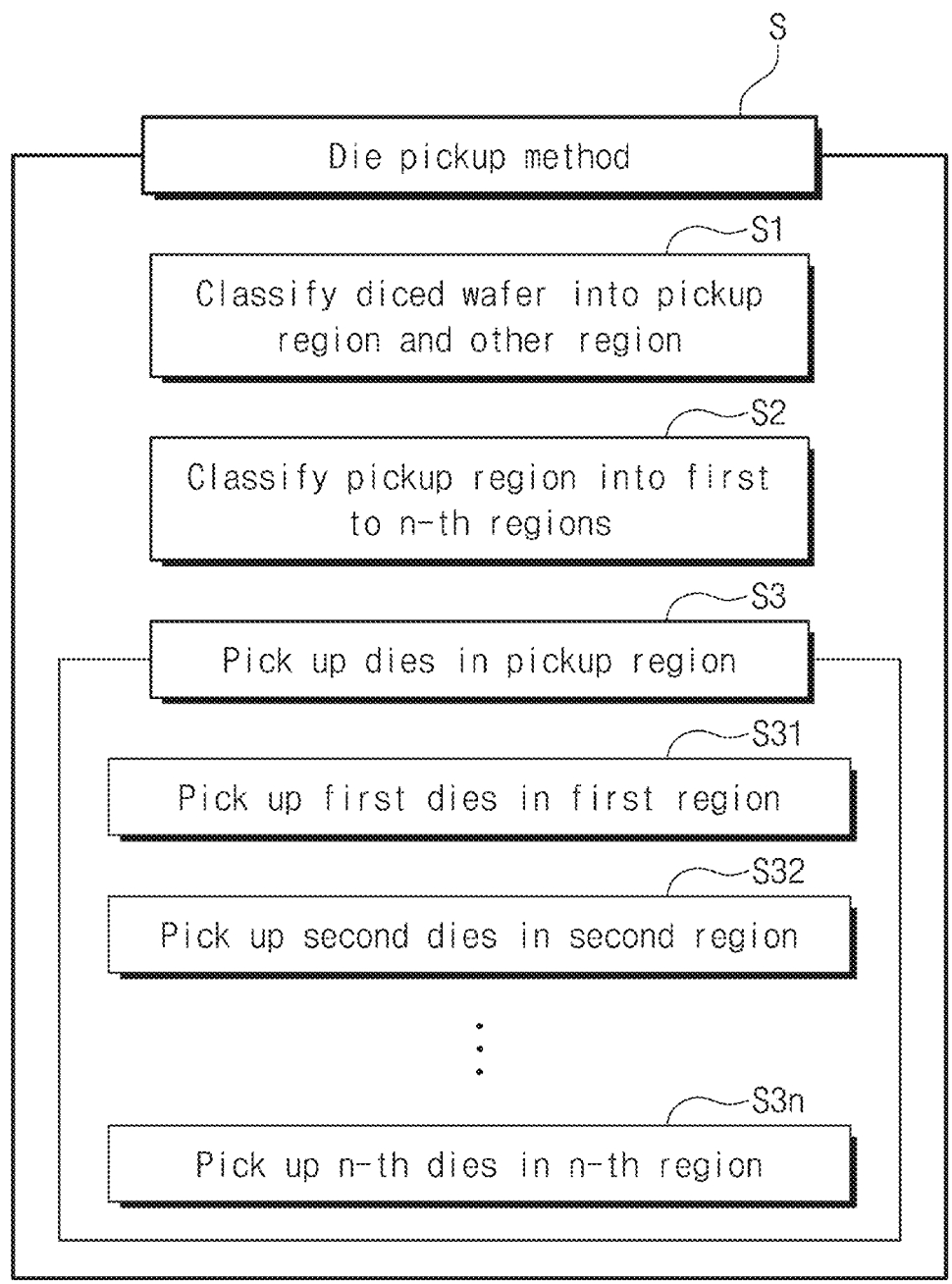
FIG. 3B is a flow chart illustrating a die pickup method which is performed as a part of a method of manufacturing a semiconductor package, according to some example embodiments of the inventive concepts.

FIG. 3B is a flow chart illustrating a die pickup method which is performed as a part of a method of manufacturing a semiconductor package, according to some example embodiments of the inventive concepts.

Referring to FIG. 3B, a die pickup method S may be provided. The die pickup method S may mean a method which is used to perform the picking up of the die from the diced wafer (in MS4) in FIG. 3A. The die pickup method S may include classifying a diced wafer into a pickup region and other region (in S1), classifying the pickup region into first to n-th regions (in S2), and picking up dies in the pickup region (in S3).

The picking up of the dies in the pickup region (in S3) may include picking up first dies in the first region (in S31), picking up second dies in the second region (in S32), . . . , and picking up n-th dies in the n-th region (in S3$n$).

In some example embodiments, "n" as used herein may be a natural number (e.g., any positive integer). In some example embodiments, the value n may be a natural number (e.g., positive integer) that is equal to or greater than 3. Restated, the value of the number "n" may be equal to or greater than 3. In some example embodiments, the number may be equal to or greater than 8; restated, the value of "n" may be equal to or greater than 8. For example, if the number n is 8, in the classifying of the pickup region into the first to n-th regions (in S2), the pickup region may be classified into first to eighth regions. In other words, the pickup region may be divided into eight regions. In addition, the picking up of the dies in the pickup region (in S3) may be composed of eight steps.

In the picking up of the dies in the pickup region (in S3), the sub-steps S31 to S3n may not be overlapped with each other in time. More specifically, if a step of picking up y-th dies in a y-th region is started, a step of picking up other dies in other region may not be started, until all of the y-th dies are picked up. Here, the y may be a natural number that is smaller than or equal to the number n. That is, if a step of picking up dies in a specific region is started, a step of picking up other dies in other region can be started only when all dies in the specific region are picked up. For example, in a process of performing a pickup step on dies in first to n-th regions (e.g., S3), the process may include performing a pickup step on (x+1)-th dies in an (x+1)-th region (e.g., S3(x+1)) subsequently to completing performing a pickup step on all of the x-th dies in the x-th region (e.g., S3(x)) (where, for example, x<n).

The picking up of the first dies in the first region (in S31), the picking up of the second dies in the second region (in S32), . . . , and the picking up of the n-th dies in the n-th region (in S3n) are sequentially illustrated in FIG. 3B, but the order of the pickup steps may be changed from that in FIG. 3B. For example, the picking up of the second dies in the second region (in S32) may be performed before the picking up of the first dies in the first region (in S31).

Hereinafter, the die pickup method according to the flow charts of FIGS. 3A and 3B and the method of manufacturing a semiconductor package using the same will be described in more detail with reference to FIGS. 4 to 16.

FIGS. 4, 5, 6, 7, 8, 9, 10, 11, 12, 13, 14, and 15 are diagrams sequentially illustrating a process of picking up a die and manufacturing a semiconductor package, according to the flow charts of FIGS. 3A and 3B according to some example embodiments of the inventive concepts.

Figure 4:
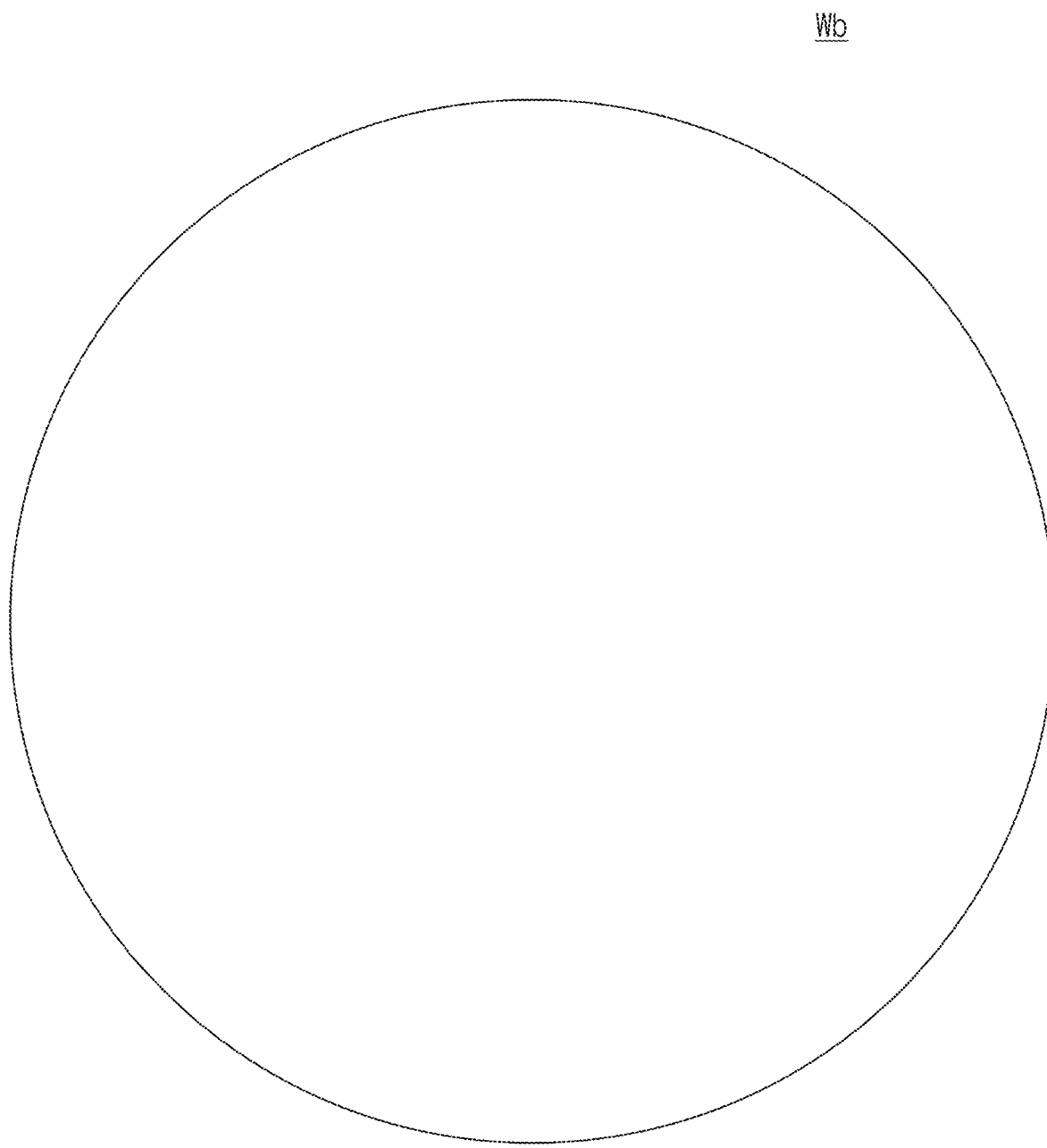
FIGS. 4, 5, 6, 7, 8, 9, 10, 11, 12, 13, 14, and 15 are diagrams sequentially illustrating a process of picking up a die and manufacturing a semiconductor package, according to the flow charts of FIGS. 3A and 3B according to some example embodiments of the inventive concepts.

Referring to FIGS. 4 and 3A, the preparing of the wafer (in MS1) may include preparing the wafer Wb, on which an integrated circuit (IC) formed through various processes is provided. The wafer Wb may include a silicon wafer or the like, but the inventive concepts are not limited to this example. There may be an integrated circuit, which is formed by a photolithography process, an etching process, a deposition process, and/or a test process, on the wafer Wb.

Figure 5:
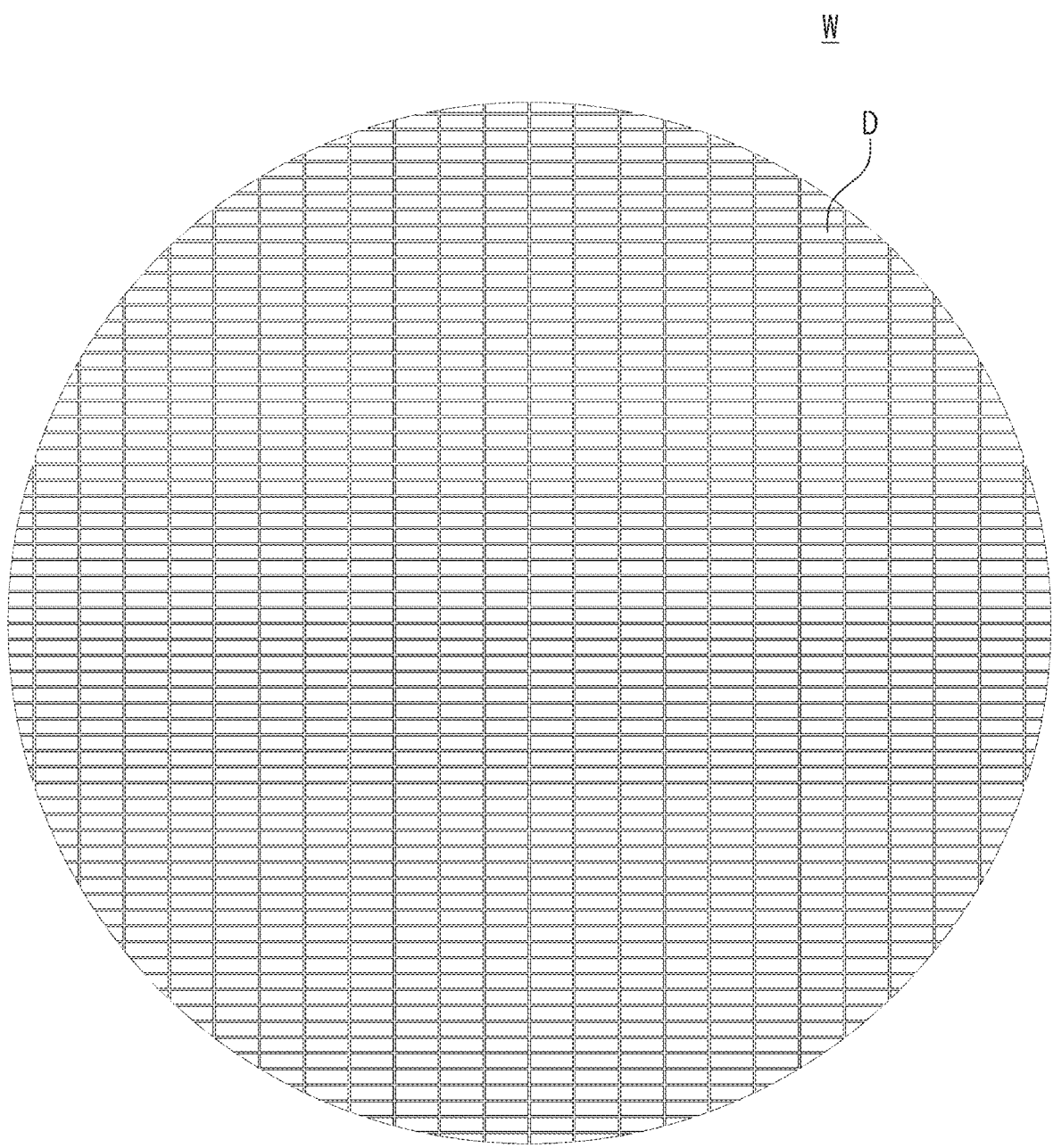

Referring to FIGS. 5, 1, and 3A, the dicing of the wafer (in MS2) may include placing the wafer W on the dicing stage DST. The wafer W may be diced by the dicing apparatus DA. For example, the dicing apparatus DA may dice the wafer W through a laser dicing method, a blade dicing method, or a plasma dicing method. The wafer W may be divided into a plurality of dies D, thereby establishing a diced wafer W. In the present specification, the term "diced wafer W" may mean a group of dies D that are collectively located at their positions before the pickup step.

Referring to FIGS. 5, 2, and 3A, the expanding of the diced wafer (in MS3) may include expanding the dicing tape DT to expand the wafer W. The expanding of the wafer W may be performed on the stage ST (e.g., see FIG. 2). The expansion of the wafer W may mean that distances between the dies D in the diced wafer W are increased.

Figure 6:
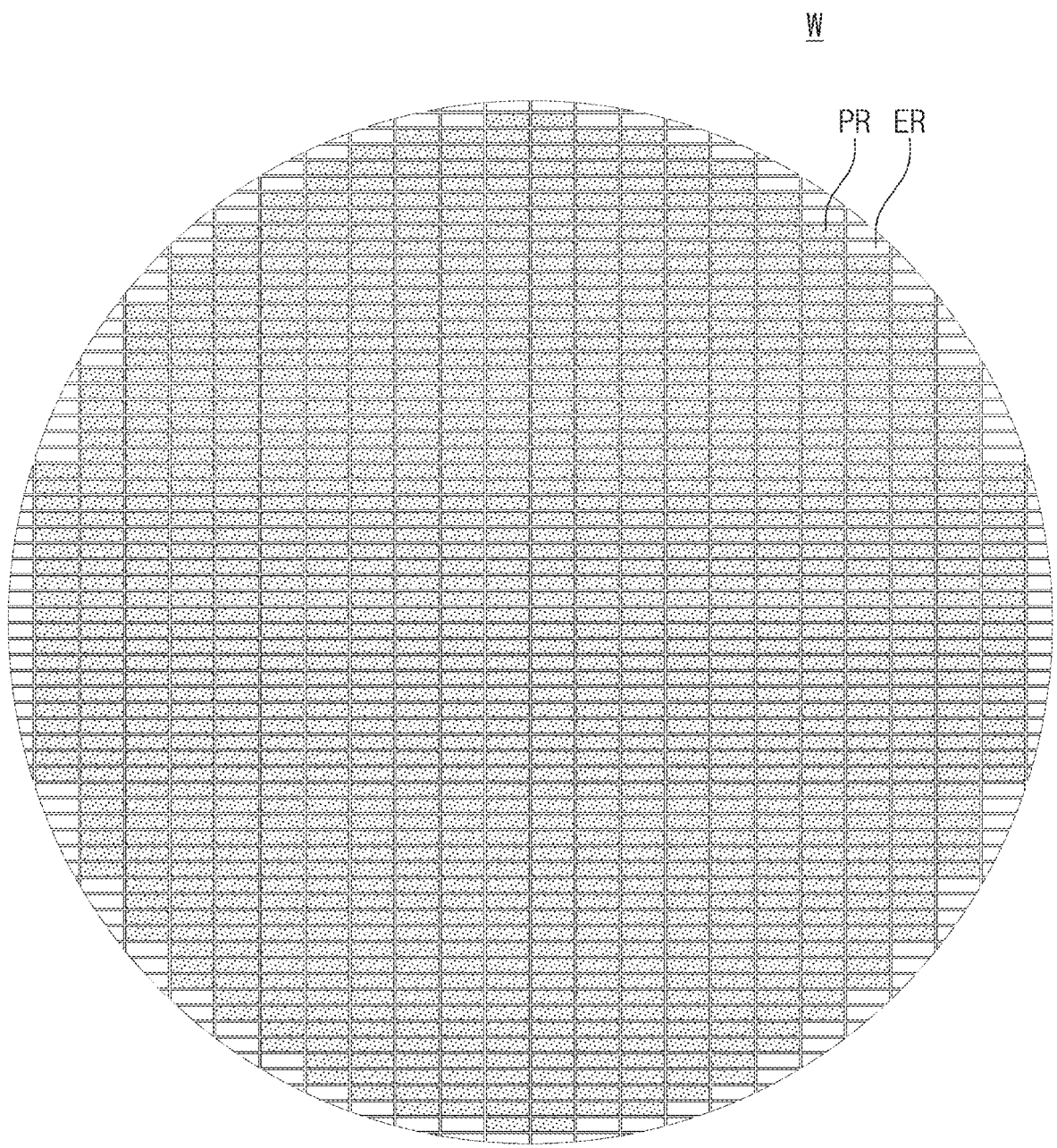

Referring to FIGS. 6 and 3B, the classifying of the diced wafer into the pickup region and other region (in S1) may include a region of the diced wafer W, on which the dies with an integrated circuit are placed. A region, on which the dies with the integrated circuit are placed, may be referred to as the pickup region PR. A die in the pickup region PR may be referred to as a targeted pickup die. A region, on which the dies without the integrated circuit are placed, may be referred to as the other region ER. The other region ER may be located outside the pickup region PR. In other words, the other region ER may be provided to enclose the pickup region PR, when viewed in a plan view. The dies in the other region ER may be removed from the dicing tape DT (e.g., see FIG. 2), before the pickup step. In some example embodiments, the dies in the other region ER may be left in a corresponding position, during picking up the targeted pickup die in the pickup region PR. Hereinafter, for convenience, the dies in the other region ER may be omitted from the drawing.

Figure 7:
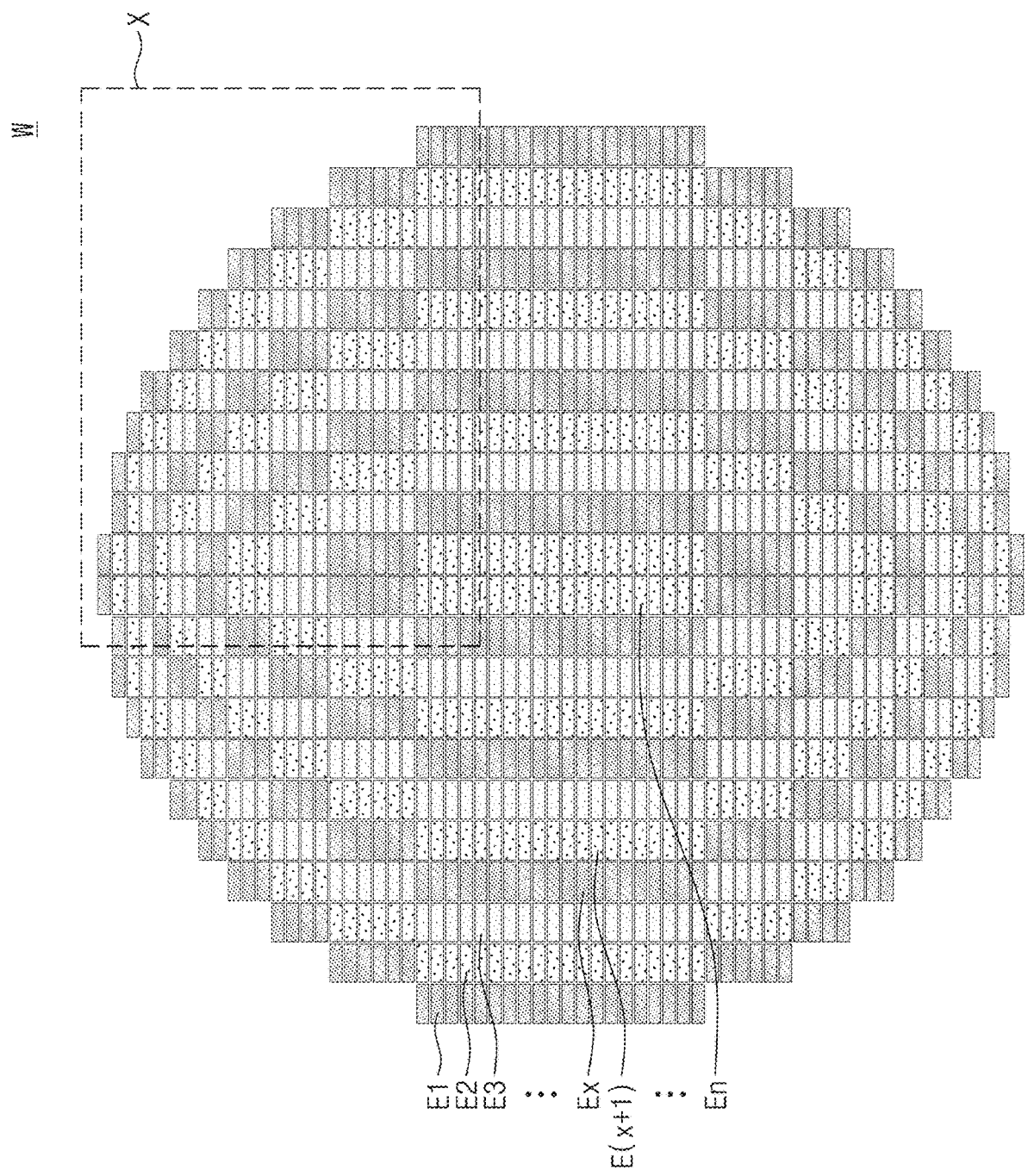
Figure 8:
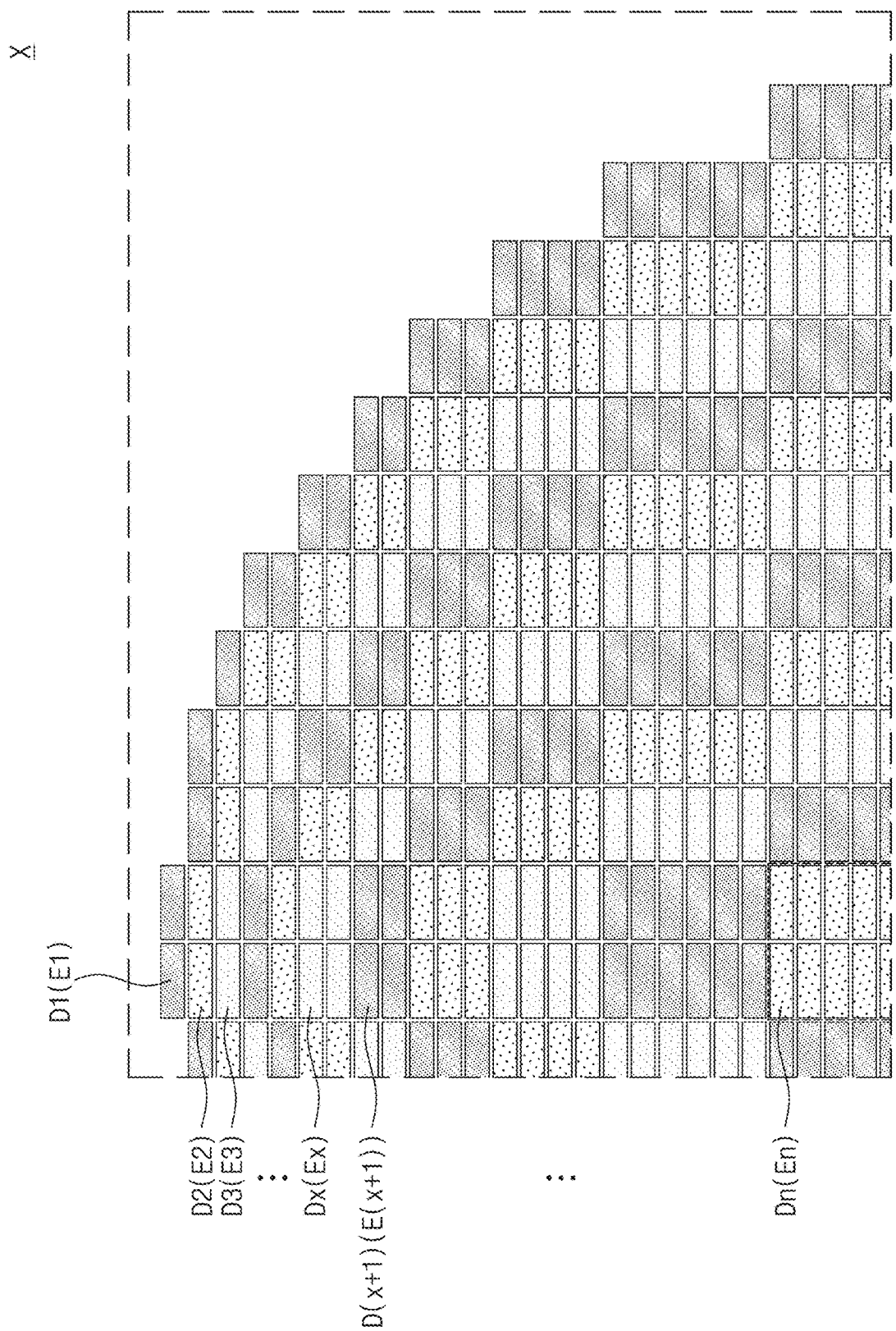

Referring to FIGS. 7, 8, and 3B, the classifying of the pickup region into the first to n-th regions (in S2) may include classifying the pickup region PR (e.g., see FIG. 6) into n regions. In the present specification, the expression 'the classifying of the region' may mean that in order to classify a plurality of dies in the diced wafer W into several kinds of dies, the control unit C (e.g., see FIG. 1) recognizes the diced wafer W as several distinct regions. The pickup region PR may be classified into a first region E1, a second region E2, a third region E3, . . . , an x-th region Ex, an (x+1)-th region E(x+1), . . . , and an n-th region En. Here, the n is a natural number that is greater than 5. For example, FIG. 7 illustrates an example in which the number n is 11. In addition, the x is an arbitrary natural number that is smaller than the number n.

The first region E1 may mean a region provided with the outermost dies of the targeted pickup dies. The outermost die may mean a die which has at least one side that is exposed to the outside of the pickup region PR (e.g., see FIG. 6). A die, which is placed in the first region E1, may be called a first die D1. Hereinafter, a die, which is placed in the x-th region Ex, may be called an x-th die Dx.

The (x+1)-th region E(x+1) may include regions which are occupied by dies adjacent to at least one of the x-th dies Dx in the x-th region Ex. In the present specification, the expression 'two dies are adjacent to each other' may mean that the dies are disposed to have sides facing each other. In addition, the (x+1)-th region E(x+1) may be placed inside (e.g., at least partially enclosed by, within the pickup region PR of the diced wafer W) the x-th region Ex. Restated, and as shown in at least FIGS. 7 and 8, the (x+1)-th region E(x+1) may be proximate to a center of the pickup region PR, which may be the same as a center of the diced wafer W, in relation to the x-th region Ex. It will be understood that, at described herein, a region that is "inside" another region may be closer to (e.g., proximate to) a center of a pickup region PR of the diced wafer W and/or closer to the center of the diced wafer W in relation to the other region and may be understood to be at least partially "enclosed by" the other region within the pickup region PR and/or the diced wafer W. Further restated, the x-th region Ex may be between the (x+1)-th region and an outside of the pickup region PR of the diced wafer W. In the present specification, the expression 'an A region is placed inside a B region' may mean that the A region is closer to a center of the wafer W than the B region, when viewed in a plan view. For example, the second region E2 may include all regions which are occupied by dies adjacent to at least one of the first dies D1.

Furthermore, the second region E2 may be placed inside the first region E1. A die in the second region E2 may be called a second die D2.

As shown in FIGS. 7 and 8, the (x+1)-th region E(x+1) may be composed of only regions which are occupied by dies adjacent to at least one of the x-th dies Dx in the x-th region Ex. However, the inventive concepts are not limited to this example, and in some example embodiments, the (x+1)-th region E(x+1) may include regions, which are occupied by dies adjacent to at least one of the x-th dies Dx in the x-th region Ex, and inside regions thereof. This will be described in more detail with reference to FIG. 16.

The n-th region En may include a center of the wafer W. In other words, the n-th region En may be the innermost region of the wafer W. In addition, the n-th region En may have a rectangular shape. For example, as shown in FIGS. 7 and 8, the n-th region En may have a vertically-elongated rectangular shape. The n-th region En of the rectangular shape may have a short side that is in contact with one or two n-th dies Dn. In other words, among the n-th dies Dn in the n-th region En, the number (e.g., quantity) of the n-th dies Dn in contact with the short side of the n-th region En may be less than or equal to 2. For example, the number (e.g., quantity) of the n-th dies Dn in contact with the short side of the n-th region En may be 1 or 2.

Referring to FIGS. 7 and 8 in conjunction with the above definition of the regions, each region from the first region E1 to the n-th region En may have a decreasing diameter with decreasing distance to the center of the wafer W. As described above, the pickup region PR (e.g., see FIG. 6) of the wafer W may be classified into the first to n-th regions E1 to En, which are separately recognized by the control unit C (e.g., see FIG. 1).

Figure 9:
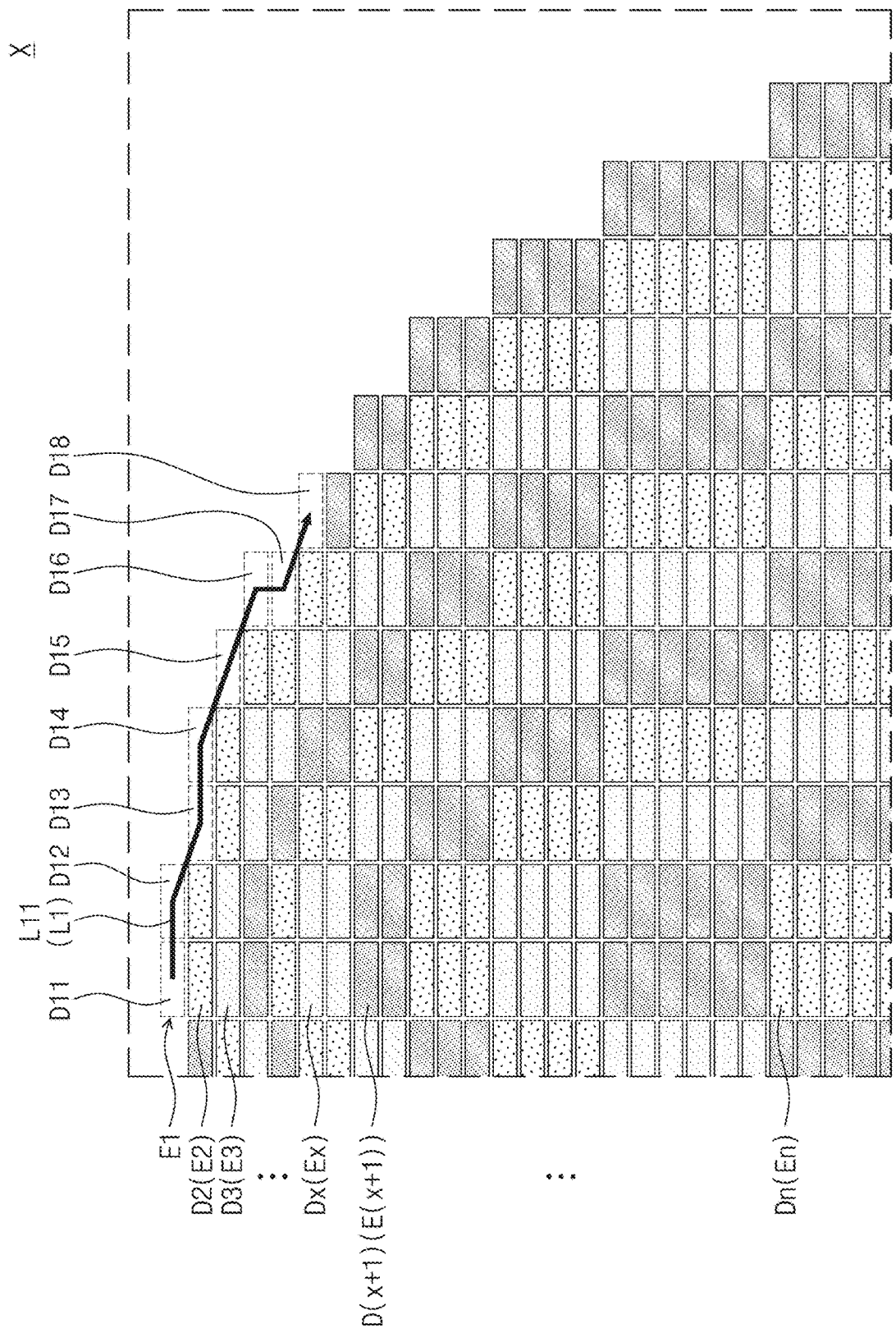

Referring to FIGS. 9 and 3B, the picking up of the first dies in the first region (in S31) may include picking up a plurality of first dies (e.g., D11 to D18 and so forth) in the first region E1. More specifically, the die picker P (e.g., see FIGS. 1 and 2) may pick up the first dies D11 to D18 and so forth one by one (the term "one by one" may interchangeably be referred to as "sequentially" herein). The die picker P may pick up one of the first dies and then pick up another of the first dies mostly adjacent thereto. For example, a (1-1)-th die D11 may be picked up, and then, a (1-2)-th die D12 may be picked up. (1-3)-th to (1-8)-th dies D13 to D18 may be sequentially picked up one by one. According to this die pickup order, it may be possible to reduce a moving distance of the stage ST (e.g., see FIGS. 1 and 2) for successive die pickup steps. Thus, it may be possible to reduce a process time. Hereinafter, a line, which is drawn to depict the pickup order of the first dies (i.e., D11 to D18 and so forth) to be sequentially picked up from the first region E1, will be referred to as a first pickup line L1.

Figure 10:
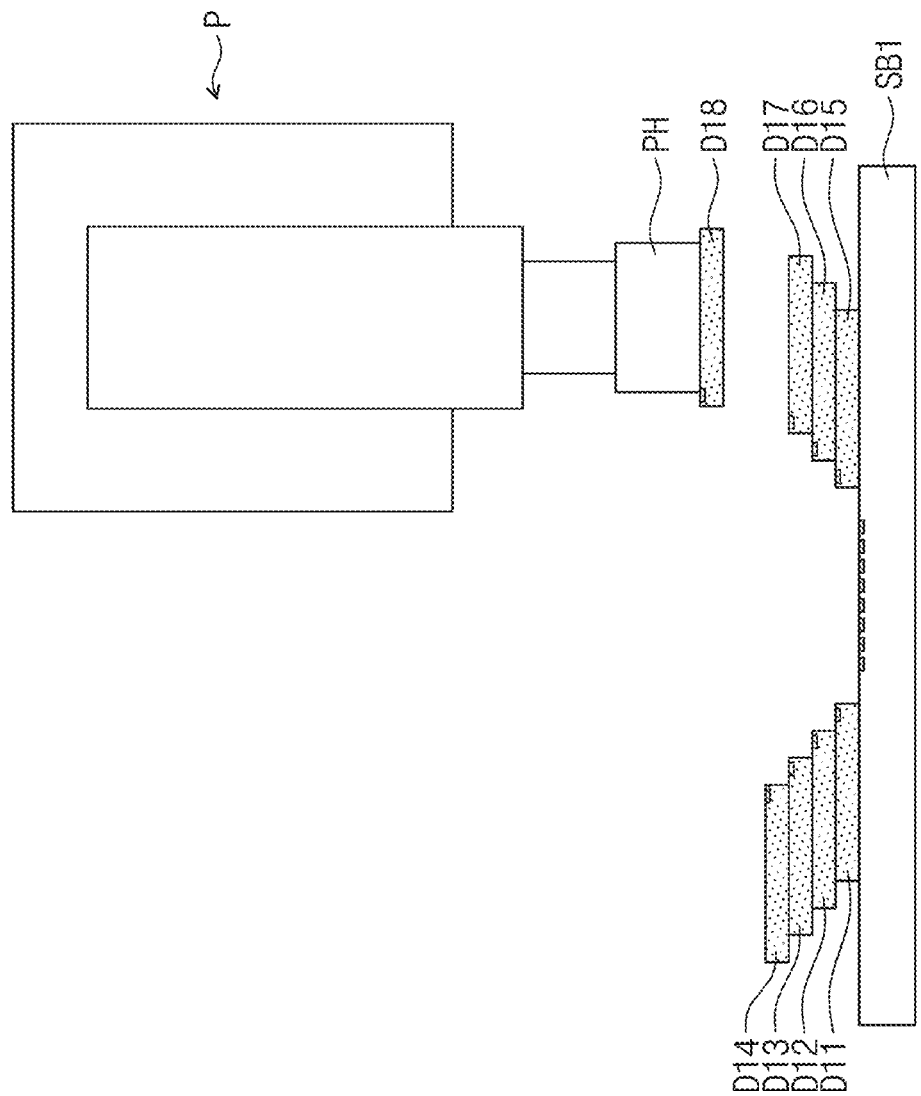

Referring to FIGS. 10 and 3A, the stacking of the picked-up die on the substrate (in MS5) may include stacking a plurality of first dies (e.g., D11 to D18) on a first substrate SB1 using the die picker P. In other words, a plurality of dies may be stacked on the first substrate SB1. For example, the (1-1)-th to (1-8)-th dies D11 to D18 may be stacked on the first substrate SB1. In other words, eight dies may be stacked on the first substrate SB1. The (1-1)-th to (1-4)-th dies D11 to D14 may be sequentially stacked in an upward direction. The (1-5)-th to (1-8)-th dies D15 to D18 may be sequentially stacked in the upward direction. The (1-5)-th to (1-8)-th dies D15 to D18, which are vertically stacked, may be horizontally spaced apart from the (1-5)-th to (1-8)-th dies D15 to D18, which are vertically stacked.

Referring back to FIG. 9, a line, which is drawn to depict a stacking order of dies, which are located on the first pickup line L1 and will be sequentially stacked on the first substrate SB1 (e.g., see FIG. 10), will be referred to as a (1-1)-th pickup line L11. In the case where eight dies are stacked on the first substrate SB1, the number of the dies on the (1-1)-th pickup line L11 may be eight.

Figure 11:
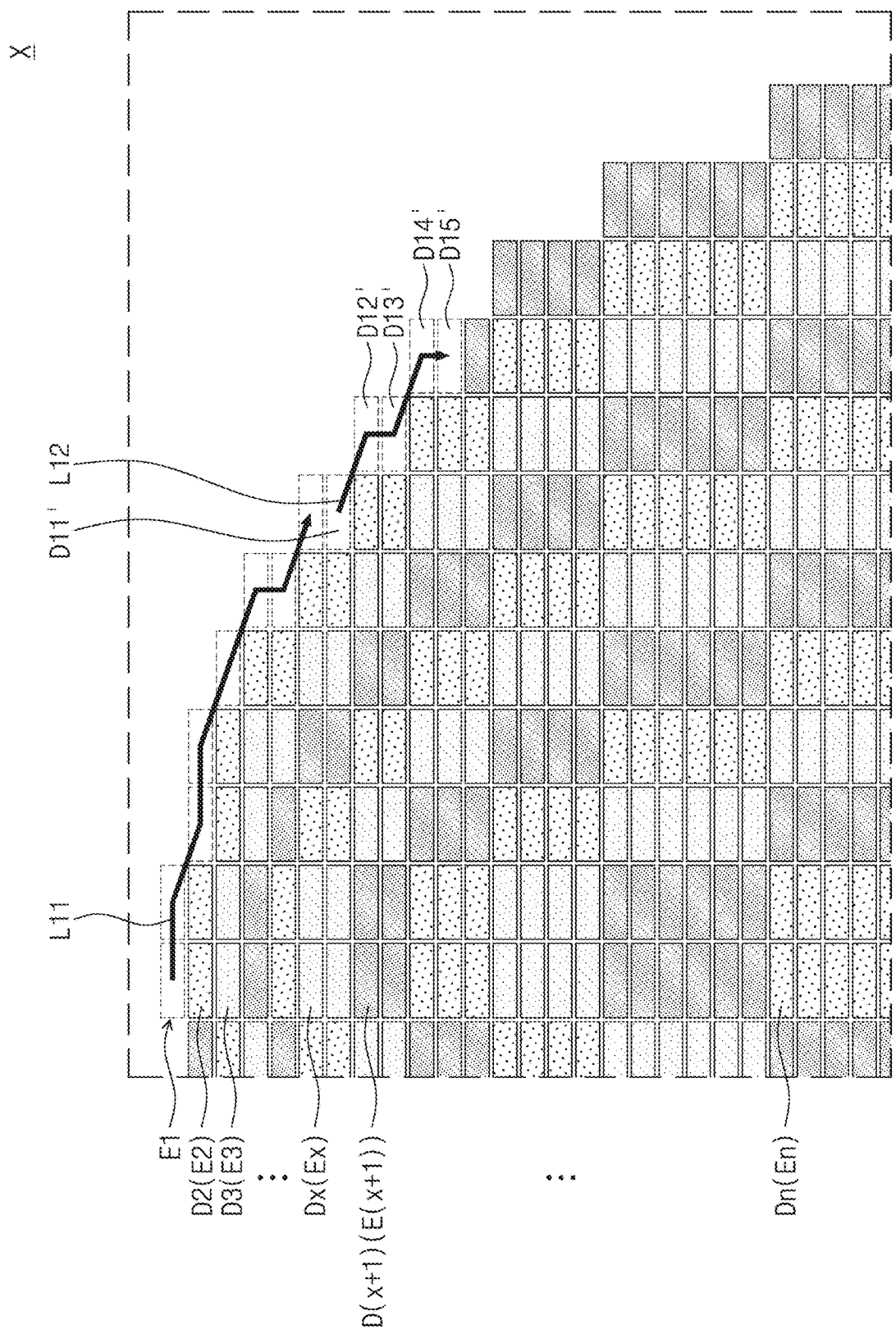

Referring to FIG. 11, a (1-1')-th die D11', which is adjacent to the (1-8)-th die D18, may be picked up, after the picking up of the (1-1)-th to (1-8)-th dies D11 to D18 described with reference to FIGS. 9 and 10. Thereafter, the step of picking up a die in the first region E1 may be sequentially performed one by one from a die adjacent to the (1-1')-th die D11'. A line, which is extended from the (1-1')-th die D11' and is drawn to sequentially connect eight dies, will be referred to as a (1-2)-th pickup line L12.

Figure 12:
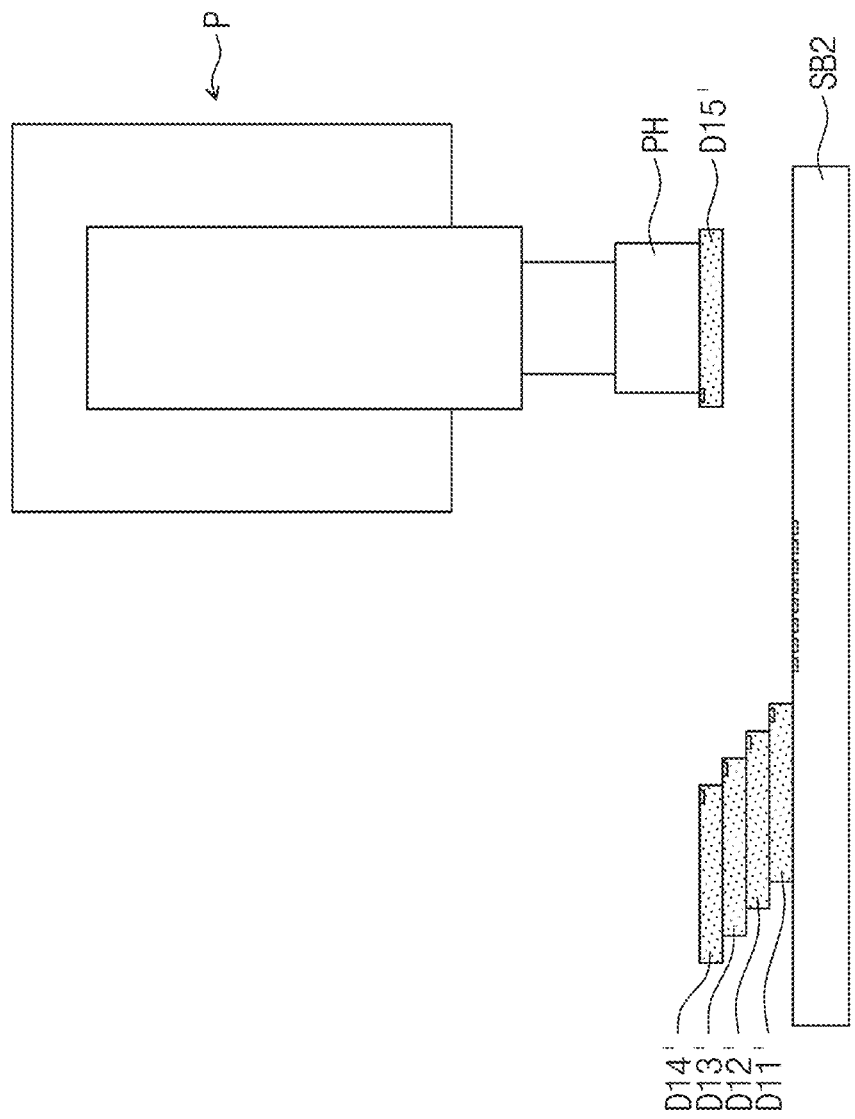

Referring to FIG. 12, eight dies including the (1-1')-th die D11' may be sequentially stacked on a second substrate SB2. The second substrate SB2 may be another substrate that is distinct from the first substrate SB1 (e.g., see FIG. 10). The (1-2)-th pickup line L12 described with reference to FIG. 11 may mean a line connecting the dies that are stacked on the second substrate SB2.

So far, an example in which eight dies are stacked on a single substrate has been described, but the inventive concepts are not limited to this example. That is, the number of the dies stacked on a single substrate may not be eight.

Figure 13:
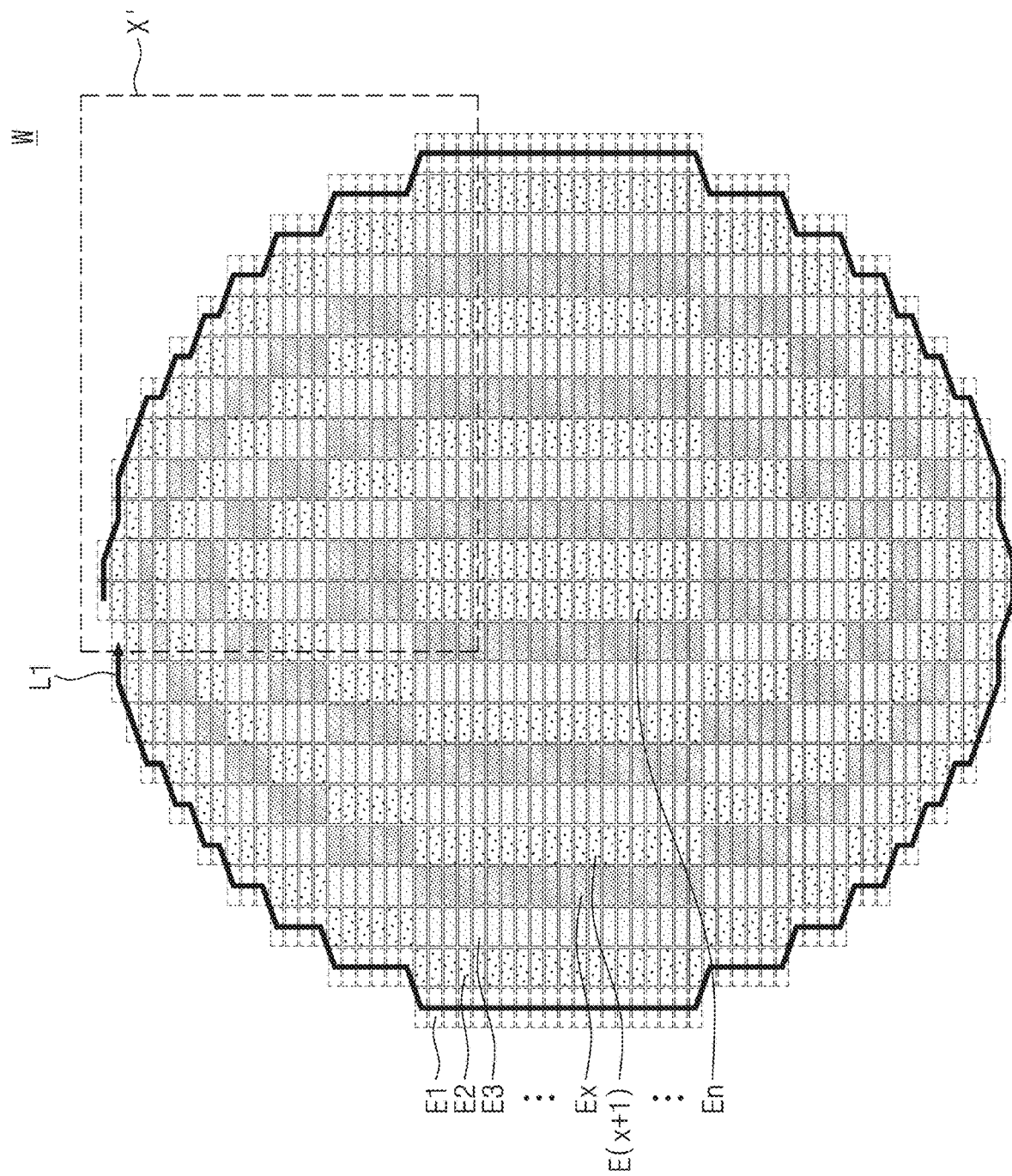
Figure 14:
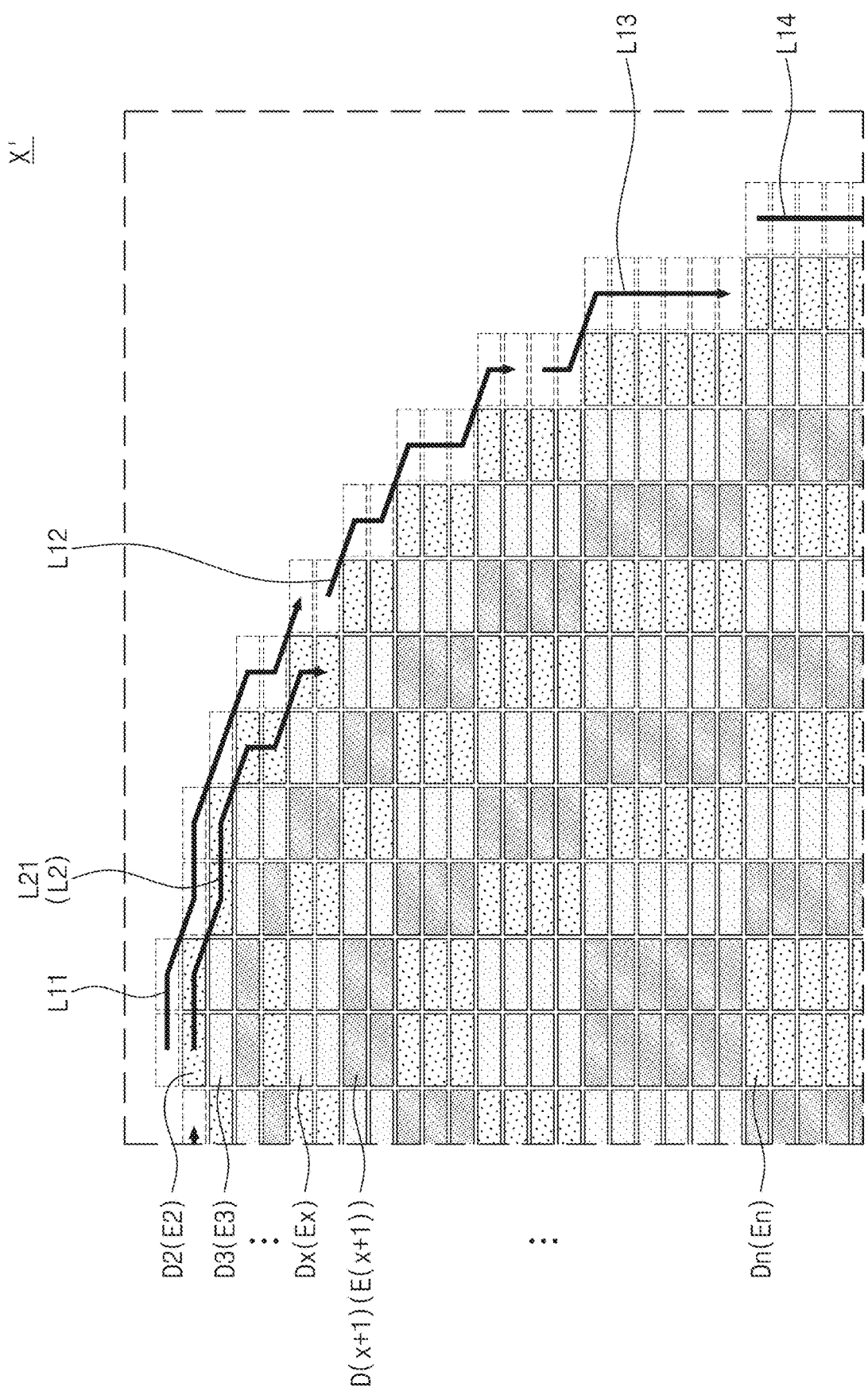

Referring to FIG. 13, the first pickup line L1 connecting the first dies on the first region E1 may be completed (e.g., "finished"). As shown in FIG. 14, the first pickup line L1 may be composed of the (1-1)-th pickup line L11, the (1-2)-th pickup line L12, a (1-3)-th pickup line L13, a (1-4)-th pickup line L14, and so forth. The first pickup line L1 may be shaped like a circle or ellipse that is drawn along roughly an edge of the wafer W. So far, the first pickup line L1 has been described to be drawn in a clockwise direction, but the inventive concepts are not limited to this example. For example, the first pickup line L1 may be drawn in a counterclockwise direction.

Referring to FIGS. 14 and 3B, the picking up of the second dies in the second region (in S32) may include picking up the second dies D2 in the second region E2. More specifically, the die picker P (e.g., see FIGS. 1 and 2) may pick up the second die D2 one by one. The die picker P may pick up one of the second dies and then pick up another of the second dies mostly adjacent thereto. Hereinafter, a line, which is drawn to depict the pickup order of the second dies D2 to be sequentially picked up from the second region E2, will be referred to as a second pickup line L2. The picked-up dies may be stacked on a substrate.

Figure 15:
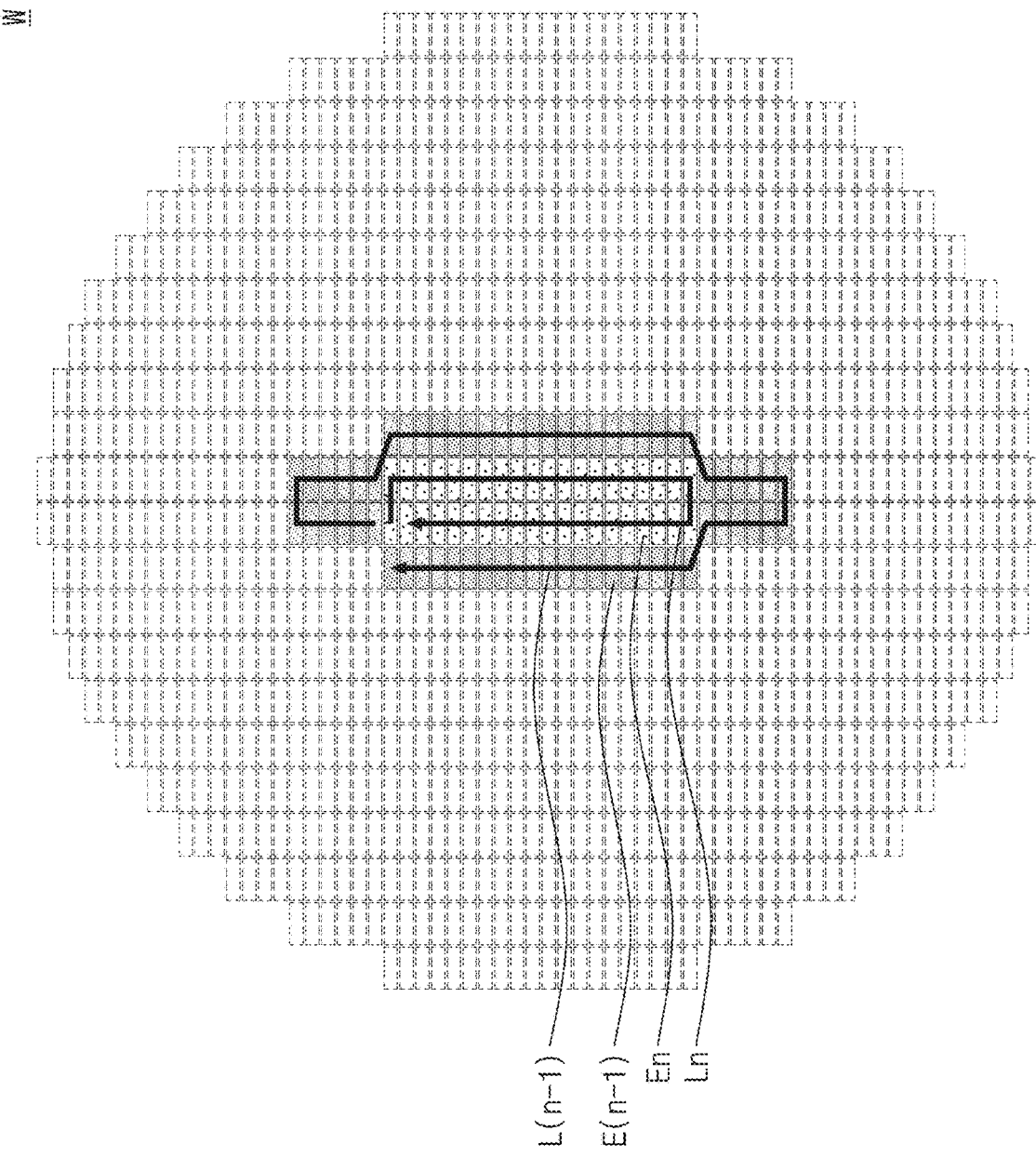

Referring to FIG. 15, an (n-1)-th pickup line L(n-1) may be a line sequentially connecting (n-1)-th dies in an (n-1)-th region E(n-1).

Referring to FIGS. 15 and 3B, the picking up of the n-th dies in the n-th region (in S3n) may include picking up the n-th dies in the n-th region En. More specifically, the die picker P (e.g., see FIGS. 1 and 2) may pick up the n-th die one by one. The die picker P may pick up one of the n-th dies and then pick up another of the n-th dies mostly adjacent thereto. Hereinafter, a line, which is drawn to depict the pickup order of the n-th dies to be sequentially picked up from the n-th region En, will be referred to as an n-th pickup line Ln. The picked-up dies may be stacked on a substrate.

The pickup line in each of the steps S31 to S3n is drawn in the clockwise direction. However, the inventive concepts are not limited to this example, and in some example embodiments, each pickup line may be drawn in the counterclockwise direction. If all pickup lines are drawn in the same direction, the overall pickup line may be shaped like an inward spiral. In some example embodiments, at least one of the pickup lines may be drawn in the clockwise direction, and the others may be drawn in the counterclockwise direction.

In addition, the picking up of the first dies in the first region (in S31) to the picking up of the n-th dies in the n-th region (in S3n) are sequentially described, but the order is not limited thereto. For example, as described above, substeps in the step (in S3 of FIG. 3) of picking up of the dies in the pickup region may be executed in a changed order.

For example, referring to FIGS. 7 and 8, the dies in the n-th region En may be first picked up, and then, a subsequent pickup step may be sequentially performed from the (n−1)-th region E(n−1) to the first region E1. That is, the pickup step may be performed on each region sequentially in an outward direction. Here, each pickup line may be drawn in the clockwise direction or in the counterclockwise direction. If all pickup lines are drawn in the same direction, the overall pickup line may be shaped like an outward spiral.

In some example embodiments, the pickup step may be first performed on the dies in the first region E1, the second region E2, and the n-th region En and then may be performed on the dies in the third to (n−1)-th regions E3 to E(n−1).

In some example embodiments, the pickup step may be first performed on the dies in the third to (n−1)-th regions E3 to E(n−1) and then may be performed on the dies in the first region E1, the second region E2, and the n-th region En.

However, if the pickup step on a specific region is started, the pickup step may not be performed on other dies in other regions until all dies in the region are picked up. That is, if the pickup step on the y-th dies in the y-th region is started, the pickup step on other regions can be started only when the pickup step on all of the y-th dies is completed. For example, in a process of performing a pickup step on dies in first to n-th regions, the process may include performing a pickup step on (x+1)-th dies in an (x+1)-th region subsequently to completing (e.g., "finishing") performing a pickup step on all of the x-th dies in the x-th region, for example where x<n. By performing a pickup step on all dies in one (x-th) region prior to performing a pickup step on dies in a next ((x+1)-th) region it may be possible to configure the movement of the stage performing the pickup step during the respective pickup step of each separate region of dies to optimize stage movement between dies being picked up from the separate region, including reducing or minimizing the motion of the stage when moving between picking up separate dies within the separate region. Thus, it may be possible to reduce the process time thereby improving efficiency of the manufacture of semiconductor packages using the process of the method, improving a yield in a process of manufacturing semiconductor packages, or the like.

Additionally, where the pickup step is performed on all dies in an x-th region before starting the pickup step on dies in an x+1-th region, an operation of stacking picked-up dies on a substrate (e.g., MS5 in FIG. 3A) may include stacking dies picked up from a same (x-th, (x+1)-th, etc.) region on a substrate. For example, the operation of stacking picked-up dies on a substrate (e.g., MS5 in FIG. 3A) may include separately stacking dies picked up from separate regions on separate substrates, such that a given stack of dies on a given substrate may include only dies picked up from a single region (e.g., dies picked up from the x-th region may be stacked on a first set of one or more substrates, and dies picked up from the (x+1)-th region are stacked on a separate, second set of one or more substrates) and may not include dies picked up from multiple regions (e.g., both (x)-th region and (x+1)-th region). Such a stacking operation may be enabled based the performing the pickup step on dies in the first to n-th regions such that a pickup step on (x+1)-th dies in the (x+1)-th region is performed subsequently to finishing performing the pickup step on all of the x-th dies in the x-th region, as the dies picked up and stacked on a substrate may be picked up from a single region of the first to n-th regions. As a result, yields of manufactured semiconductor packages may be improved based on picking up dies from an (x+1)-th region subsequently to finishing picking up dies from an x-th region, such that separate stacks of dies on separate substrates as a result of operation MS5 may include dies from separate regions being stacked on separate substrates, based on causing dies picked up from a region associated with a higher failure rate (e.g., an outermost, or edge region of the pickup region) to be concentrated in a relatively small number of stacks on substrates, while dies from the remaining region(s) may be stacked separately on other substrates, thereby mitigating the use of dies from low-failure regions with dies from high-failure regions and further improving the likelihood that dies from low-failure regions are not stacked with dies from high-failure regions. As a result, a yield of non-defective semiconductor packages (which may not include any dies from high-failure regions) may be improved.

Figure 16:
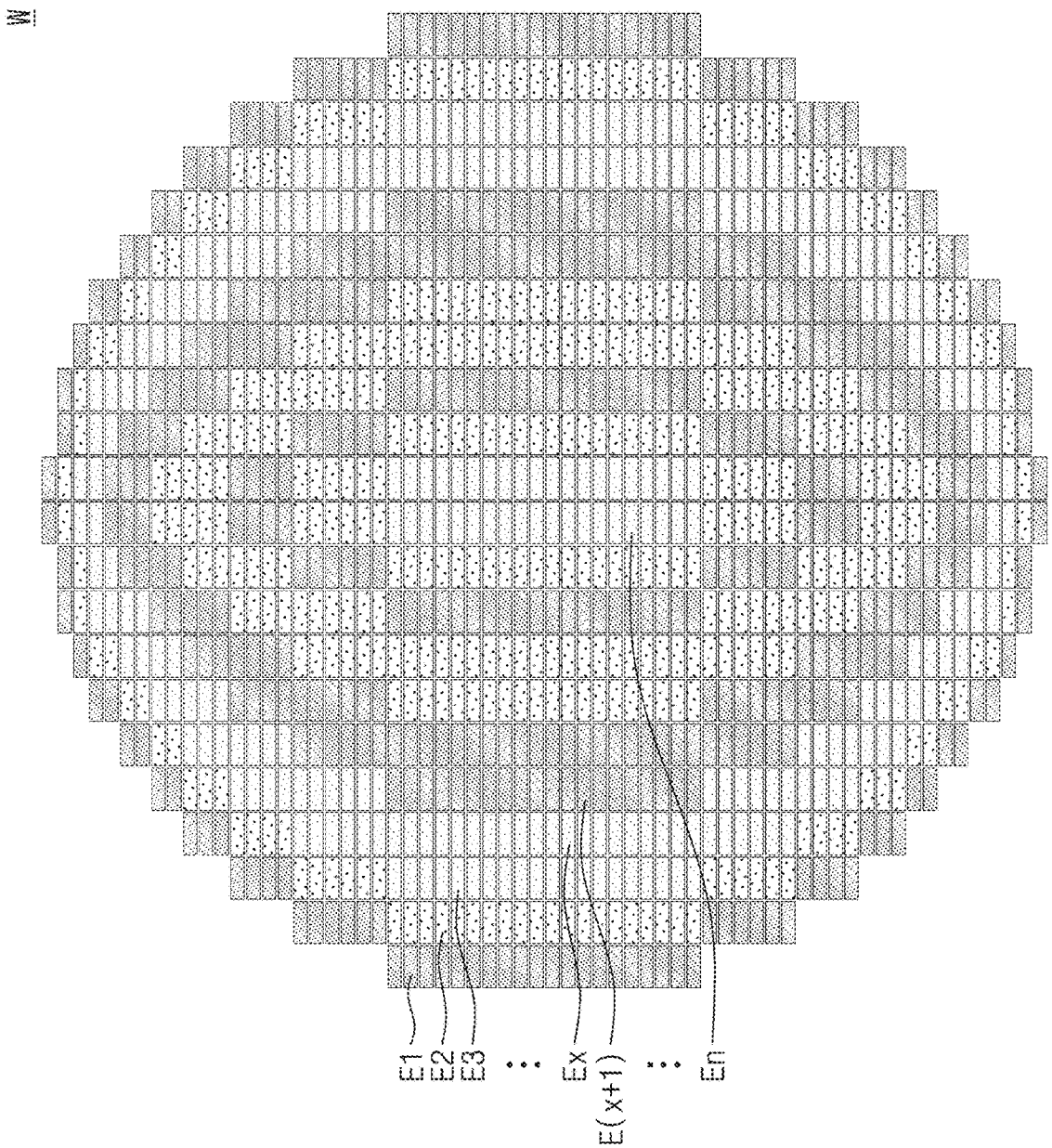
FIG. 16 is a plan view illustrating regions of a wafer classified according to some example embodiments of the inventive concepts.

FIG. 16 is a plan view illustrating regions of a wafer classified according to some example embodiments of the inventive concepts.

Hereinafter, for concise description, an element previously described with reference to FIGS. 1 to 15 may be identified by the same reference number without repeating an overlapping description thereof.

Referring to FIG. 16, the diced wafer W may be classified into the first region E1, the second region E2, . . . the x-th region Ex, . . . and the n-th region En. However, unlike that described with reference to FIG. 7, the (x+1)-th region E(x+1) in the wafer W of FIG. 16 may be composed of regions, which are occupied by dies adjacent to at least one of the x-th dies in the x-th region Ex, and inside regions thereof (e.g., proximate to a center of a pickup region PR and/or of the diced wafer W, in relation to the x-th region Ex). In other words, the (x+1)-th region E(x+1) may be composed of a plurality of dies that are provided in two or more folds.

Figure 17:
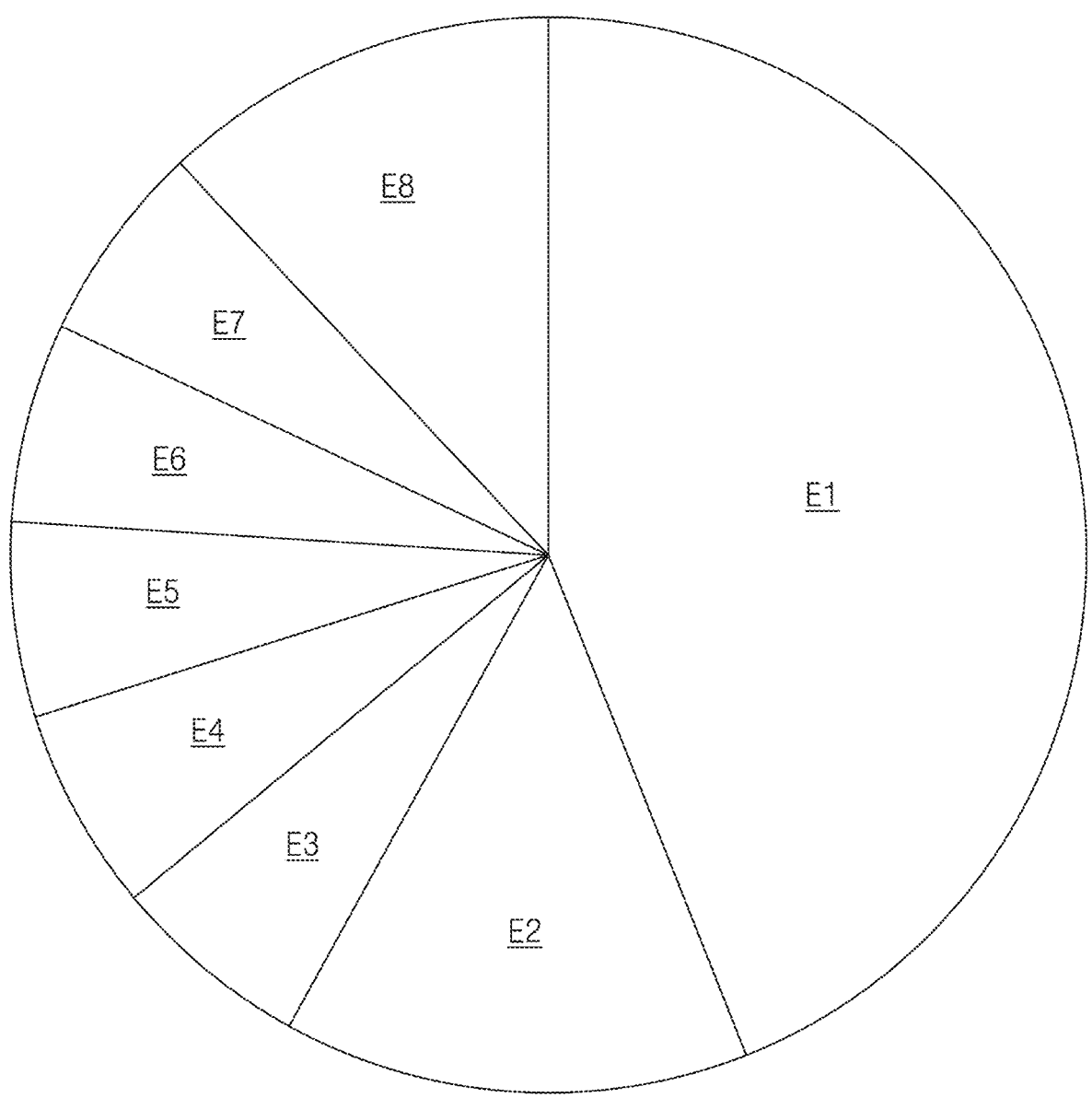
FIG. 17 is a graph showing a distribution ratio of a failed die in each region of a diced wafer according to some example embodiments of the inventive concepts.

FIG. 17 is a graph showing a distribution ratio of a failed die in each region of a diced wafer according to some example embodiments of the inventive concepts.

In detail, FIG. 17 is a circle graph showing a distribution ratio of the failed die in each region when the diced wafer is classified into the first to eighth regions E1 to E8. The failed die may be a die that is abnormally operated. More specifically, the failed die may mean a die which has a malfunctioned integrated circuit caused by various processes that are performed on a wafer during the preparing of the wafer (in MS1 of FIG. 3A). The number of the failed dies may be highest on the first region E1. For example, about 40% to 50% of the failed dies may occur in the first region E1. More specifically, about 44% of the failed dies may occur in the first region E1. Excluding the first region E1, a region with the most failed dies may be the second region E2. About 10% to 20% of the failed dies may occur in the second region E2. More specifically, about 14% of the failed dies may occur in the second region E2. Except for the first and second regions E1 and E2, a region with the most failed dies may be the eighth region E8. About 10% to 20% of the failed dies may occur in the eighth region E8. More specifically, about 12% of the failed dies may occur in the eighth region E8. The remaining ones of the failed dies may be uniformly distributed on remaining regions.

According to the afore-described die pickup method and the method of manufacturing a semiconductor package using the same, a wafer may be classified into a plurality of regions, and in this case, a process of picking up a die and stacking the die on a substrate may be performed for each region. When the wafer is classified into a plurality of regions, each region may be determined in consideration of a distance from a center of the wafer. For example, the (x+1)-th region may be classified as a region placed inside the x-th region. Restated, the (x+1)-th region may be proximate to a center of the wafer in relation to the x-th region. The x-th region may be provided to enclose the (x+1)-th region. The number or occurrence ratio of failed dies on a diced wafer may be related to the distance from the center of the wafer. That is, the number or occurrence ratio of the failed dies may be the highest in the outermost region (i.e., the first region), as described with reference to FIG. 17. In addition, the number or occurrence ratio of the failed dies may be the second in the second region. The number or occurrence ratio of the failed dies may be the third in the innermost region (i.e., the n-th region). Thus, if a wafer is classified into several regions as described above and dies in a specific region are collectively picked up, dies stacked on each substrate may have failure rates similar to each other. Even when just one of the dies stacked on the substrate is failed, the semiconductor package including the same may be sorted as a failed product. Thus, if dies, which are disposed in a specific region having a high failure rate (e.g., dies in the eight region E8), are collectively picked up and placed on the same substrate, it may be possible to reduce the risk of discarding good dies in a region having a low failure rate. This may make it possible to increase a yield in a process of manufacturing a semiconductor package.

Figure 18:
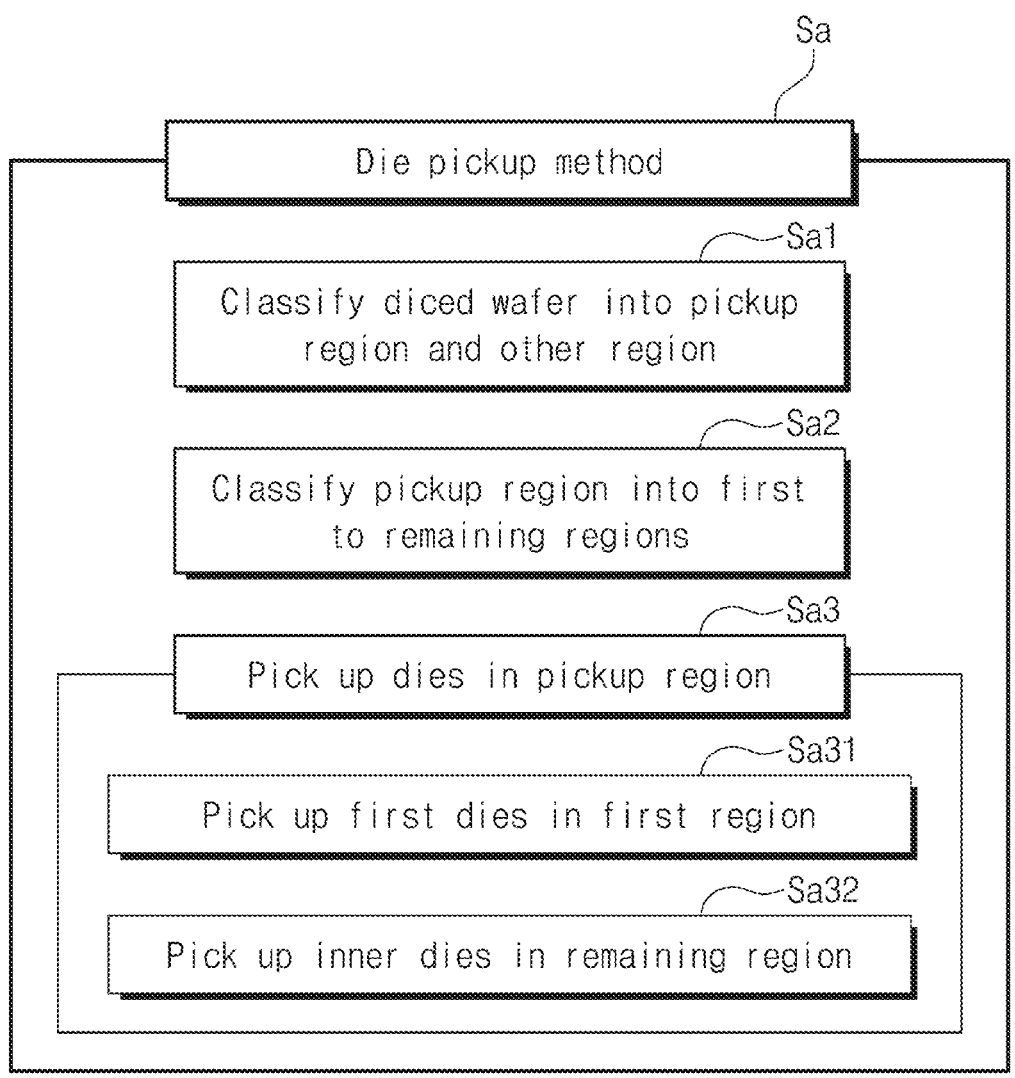
FIG. 18 is a flow chart illustrating a die pickup method which is performed as a part of a method of manufacturing a semiconductor package, according to some example embodiments of the inventive concepts.

FIG. 18 is a flow chart illustrating a die pickup method which is performed as a part of a method of manufacturing a semiconductor package, according to some example embodiments of the inventive concepts.

Hereinafter, for concise description, an element previously described with reference to FIGS. 1 to 17 may be identified by the same reference number without repeating an overlapping description thereof.

Referring to FIG. 18, a die pickup method Sa may be provided. The die pickup method Sa may include classifying a diced wafer into a pickup region and other region (in Sa1), classifying the pickup region into a first region and a remaining region (in Sa2), and picking up dies in the pickup region (in Sa3). The die pickup method Sa may mean a method which is used to perform the picking up of the die from the diced wafer (in MS4) in FIG. 3A.

The picking up of the dies in the pickup region (in Sa3) may include picking up first dies in the first region (in Sa31) and picking up inner dies in the remaining region (in Sa32).

Hereinafter, the die pickup method according to the flow chart of FIG. 18 and the method of manufacturing a semiconductor package using the same will be described in more detail with reference to FIGS. 19 to 20.

Figure 19:
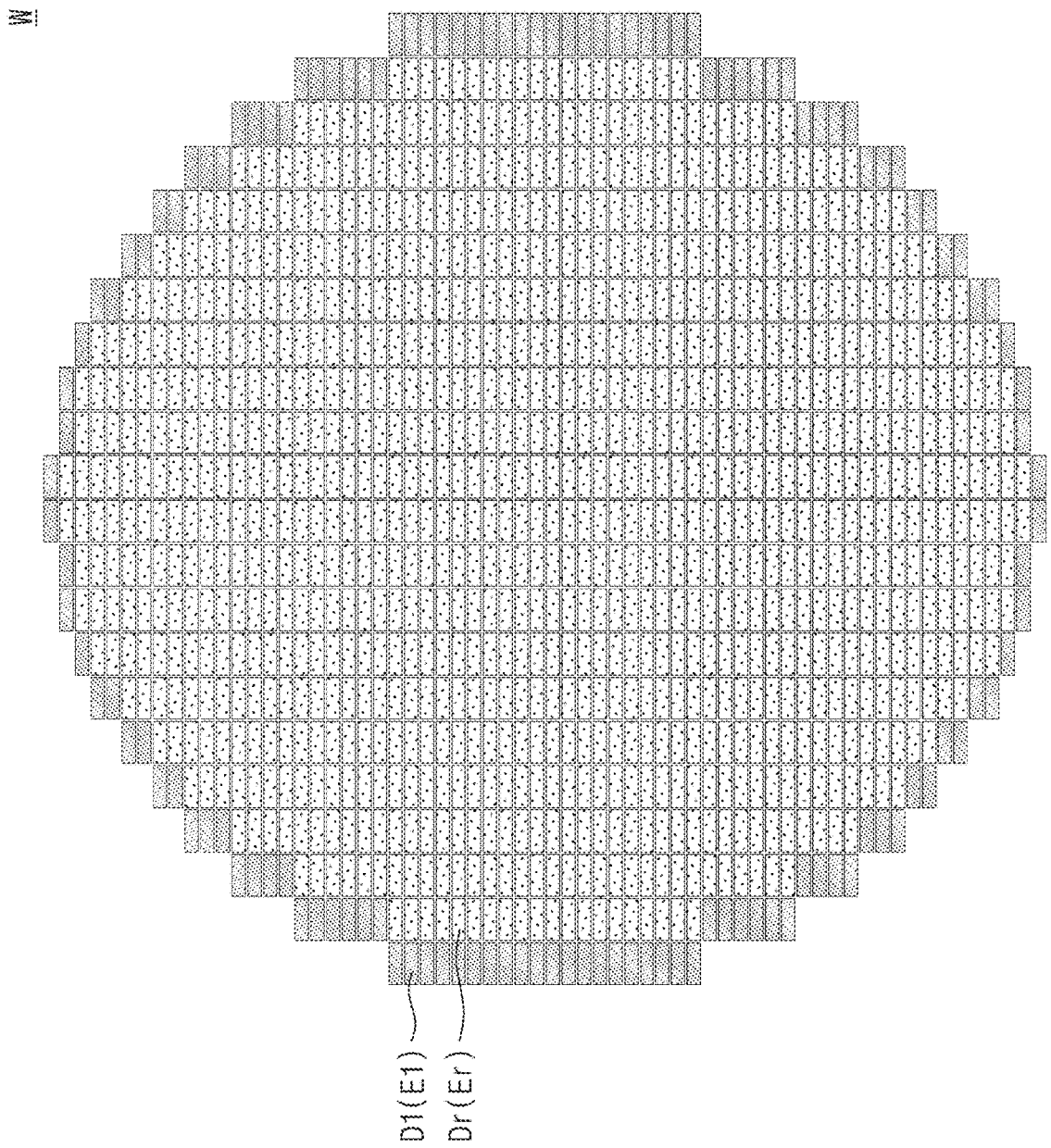
FIGS. 19 and 20 are diagrams sequentially illustrating a process of picking up a die and manufacturing a semiconductor package, according to the flow chart of FIG. 18.
Figure 20:
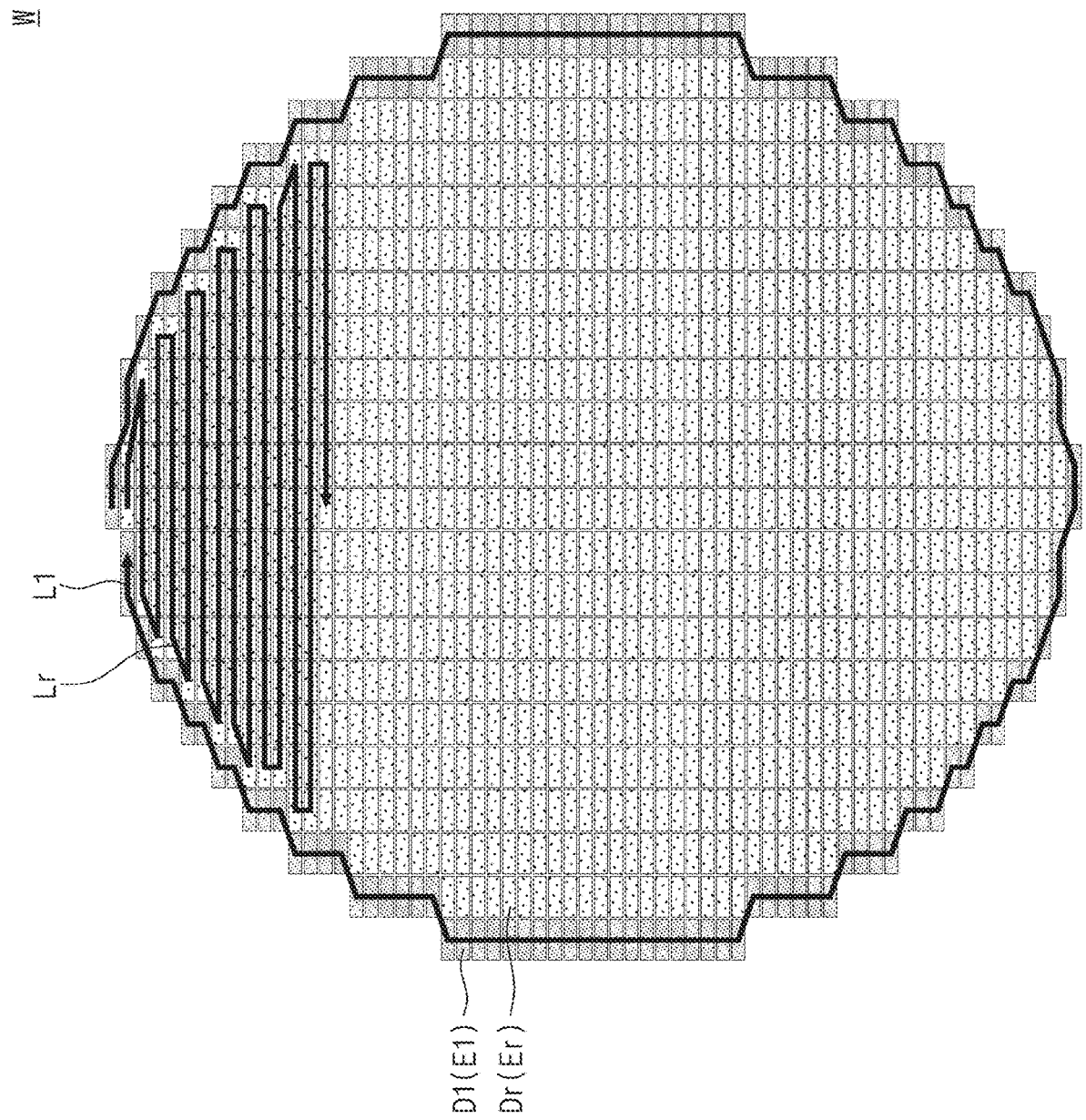

FIGS. 19 and 20 are diagrams sequentially illustrating a process of picking up a die and manufacturing a semiconductor package, according to the flow chart of FIG. 18 according to some example embodiments of the inventive concepts.

Referring to FIGS. 19 and 18, the classifying of the pickup region into the first region and the remaining region (in Sa2) may include classifying the pickup region PR (e.g., see FIG. 6) into two regions. The pickup region PR may be classified into the first region E1 and a remaining region Er.

The first region E1 may mean a region, in which the outermost dies of the targeted pickup dies are provided. The outermost die may mean a die which has at least one side that is exposed to the outside of the pickup region PR (e.g., see FIG. 6). For example, the first region E1 of FIG. 19 may be substantially the same as or similar to the first region E1 described with reference to FIG. 7. A die located in the first region E1 may be called the first die D1.

The remaining region Er may be located inside the first region E1. In other words, the first region E1 may be provided to enclose the remaining region Er, when viewed in a plan view. Restated, and as shown in at least FIGS. 19 and 20, the remaining region Er may be proximate to a center of the pickup region PR, which may be the same as a center of the diced wafer W, in relation to the first region E1. A die in the remaining region Er may be called a remaining die Dr.

Referring to FIGS. 20 and 18, the picking up of the first dies in the first region (in Sa31) may include picking up the first dies D1 one by one. The pickup order in the first region E1 may be given in a manner of sequentially picking up a die that is most adjacent to a picked-up die. Hereinafter, a line, which is drawn to depict the pickup order of the first dies D1 to be sequentially picked up from the first region E1, will be referred to as the first pickup line L1. The first pickup line L1 may be shaped like a circle or ellipse that is drawn along roughly an edge of the wafer W. So far, the first pickup line L1 has been described to be drawn in the clockwise direction, but the inventive concepts are not limited to this example. In other words, the first pickup line L1 may be given in a counterclockwise direction.

The picking up of the inner dies in the remaining region (in Sa32) may include picking up a plurality of the remaining dies Dr one by one. The pickup order in the remaining region Er may be given along a zigzag trajectory. That is, as shown in FIG. 20, the pickup step may be performed on all of the remaining dies Dr, which are placed in the outermost row or column in the remaining region Er and then may be performed on the remaining dies Dr, which are placed in another column or row adjacent there. Hereinafter, a line, which is drawn to depict the pickup order of the remaining dies Dr to be sequentially picked up from the remaining region Er, will be referred to as a remaining pickup line Lr. The remaining pickup line Lr may have a zigzag shape roughly.

The steps Sa31 to Sa32 may not be overlapped with each other in time. More specifically, until the pickup step on one group of the groups of the first dies D1 and the inner dies DR is completely finished, the pickup step may not be performed on the other group of the groups of the first dies D1 and the inner dies DR. Restated, the pickup step on the first dies D1 and the pickup step on the inner dies DR may not overlap in time (e.g., may not occur concurrently).

For example, in the case where the picking up of the first dies in the first region (in Sa31) is first performed, the picking up of the inner dies in the remaining region (in Sa32) may be performed only after all of the first dies D1 are picked up. For example, in a process of performing a pickup step on dies in first to n-th regions (e.g., Sa3), the process may include performing a pickup step on (x+1)-th dies in an (x+1)-th region (e.g., Sa31) subsequently to completing performing a pickup step on all of the x-th dies in the x-th region (e.g., Sa31).

In some example embodiments, in the case where the picking up of the inner dies in the remaining region (in Sa32) is first performed, the picking up of the first dies in the first region (in Sa31) may be performed only after all of the inner dies Dr are picked up.

According to the afore-described die pickup method and the method of manufacturing a semiconductor package using the same, the first dies, which are placed in the outermost region having the highest failure rate, may be separately picked up and may be stacked on the substrate. Thus, it may be possible to increase a yield in a process of manufacturing a semiconductor package.

In addition, the remaining dies, which are placed in the remaining region having a relatively low failure rate, may be sequentially picked up along a zigzag trajectory. Since the pickup step is performed along the zigzag trajectory, it may be possible to reduce a moving distance of the stage for successive pickup steps on two adjacent dies. The moving distance of the stage for the successive pickup steps may affect a process time. For example, if a die located in a diagonal direction is chosen as a next die to be picked up, the moving distance of the stage may be increased. By contrast, if a next die to be picked up has a side facing a side of a previously picked-up die, the stage may have a relatively short moving distance for the for successive pickup steps. Since the pickup step is performed along the zigzag trajectory, it may be possible to reduce or minimize the diagonal motion of the stage. Thus, it may be possible to reduce the process time, thereby improving efficiency of the manufacture of semiconductor packages using the process of the method, improving a yield in a process of manufacturing semiconductor packages, or the like.

According to the afore-described die pickup method and the method of manufacturing a semiconductor package using the same, the pickup step may be first performed along a circular trajectory that is given to span only the first region having an especially high failure rate, and the pickup step in the remaining region may be performed along a zigzag trajectory. Accordingly, it may be possible to improve the yield in the process of manufacturing a semiconductor package and to prevent the process time from being increased. That is, it may be possible to achieve both of the yield improvement and the shortened process.

Figure 21:
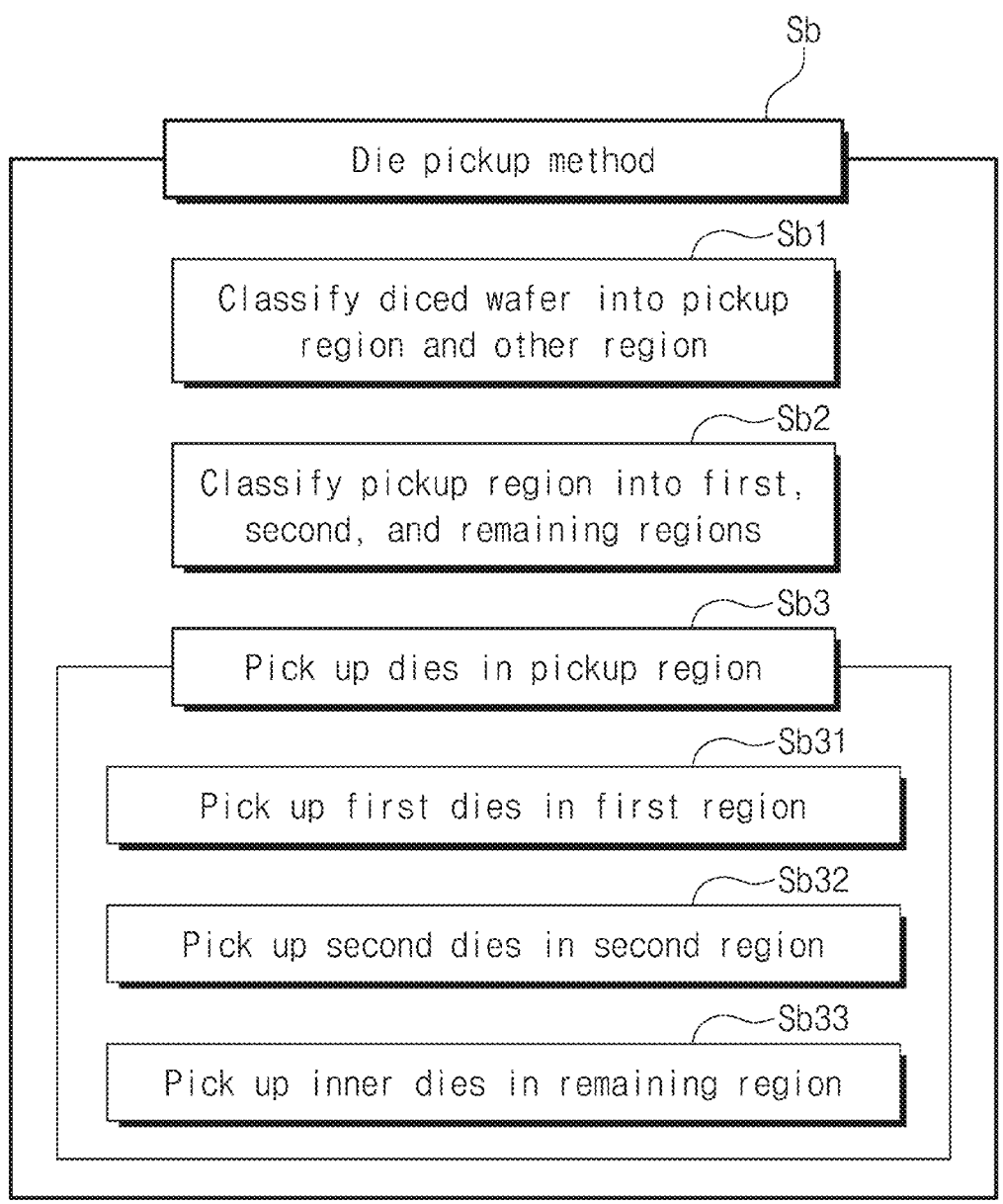
FIG. 21 is a flow chart illustrating a die pickup method which is performed as a part of a method of manufacturing a semiconductor package, according to some example embodiments of the inventive concepts.

FIG. 21 is a flow chart illustrating a die pickup method which is performed as a part of a method of manufacturing a semiconductor package, according to some example embodiments of the inventive concepts.

Hereinafter, for concise description, an element previously described with reference to FIGS. 1 to 20 may be identified by the same reference number without repeating an overlapping description thereof.

Referring to FIG. 21, a die pickup method Sb may be provided. The die pickup method Sb may include classifying a diced wafer into a pickup region and other region (in Sb1), classifying the pickup region into a first region, a second region, and a remaining region (in Sb2), and picking up dies in the pickup region (in Sb3). The die pickup method Sb may mean a method which is used to perform the picking up of the die from the diced wafer (in MS4) in FIG. 3A.

The picking up of the dies in the pickup region (in Sb3) may include picking up first dies in the first region (in Sb31), picking up second dies in the second region (in Sb32), and picking up inner dies in the remaining region (in Sb33).

Hereinafter, the die pickup method according to the flow chart of FIG. 21 and the method of manufacturing a semiconductor package using the same will be described in more detail with reference to FIGS. 22 and 22.

Figure 22:
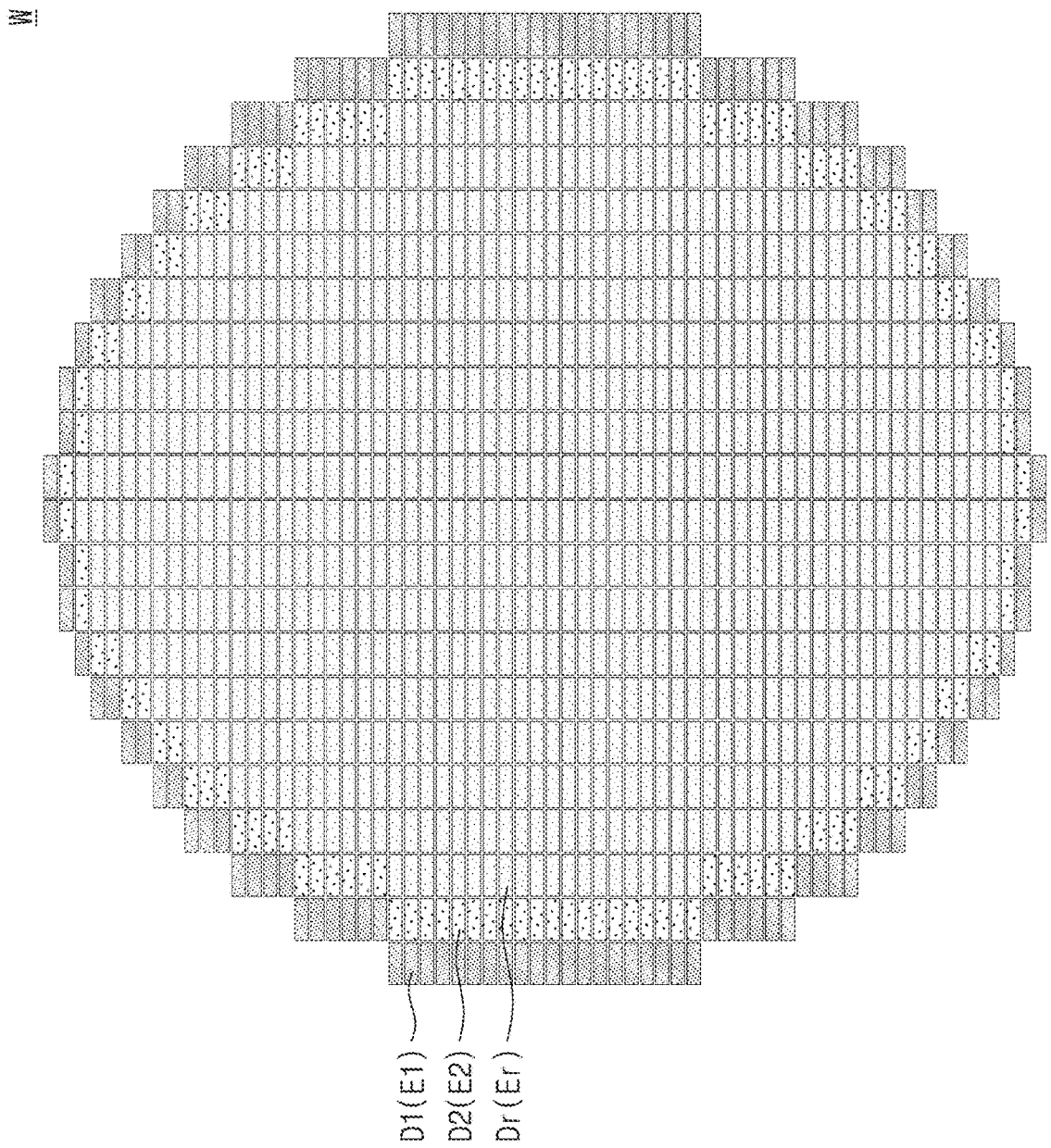
FIGS. 22 and 23 are diagrams sequentially illustrating a process of picking up a die and manufacturing a semiconductor package, according to the flow chart of FIG. 18 according to some example embodiments of the inventive concepts.
Figure 23:
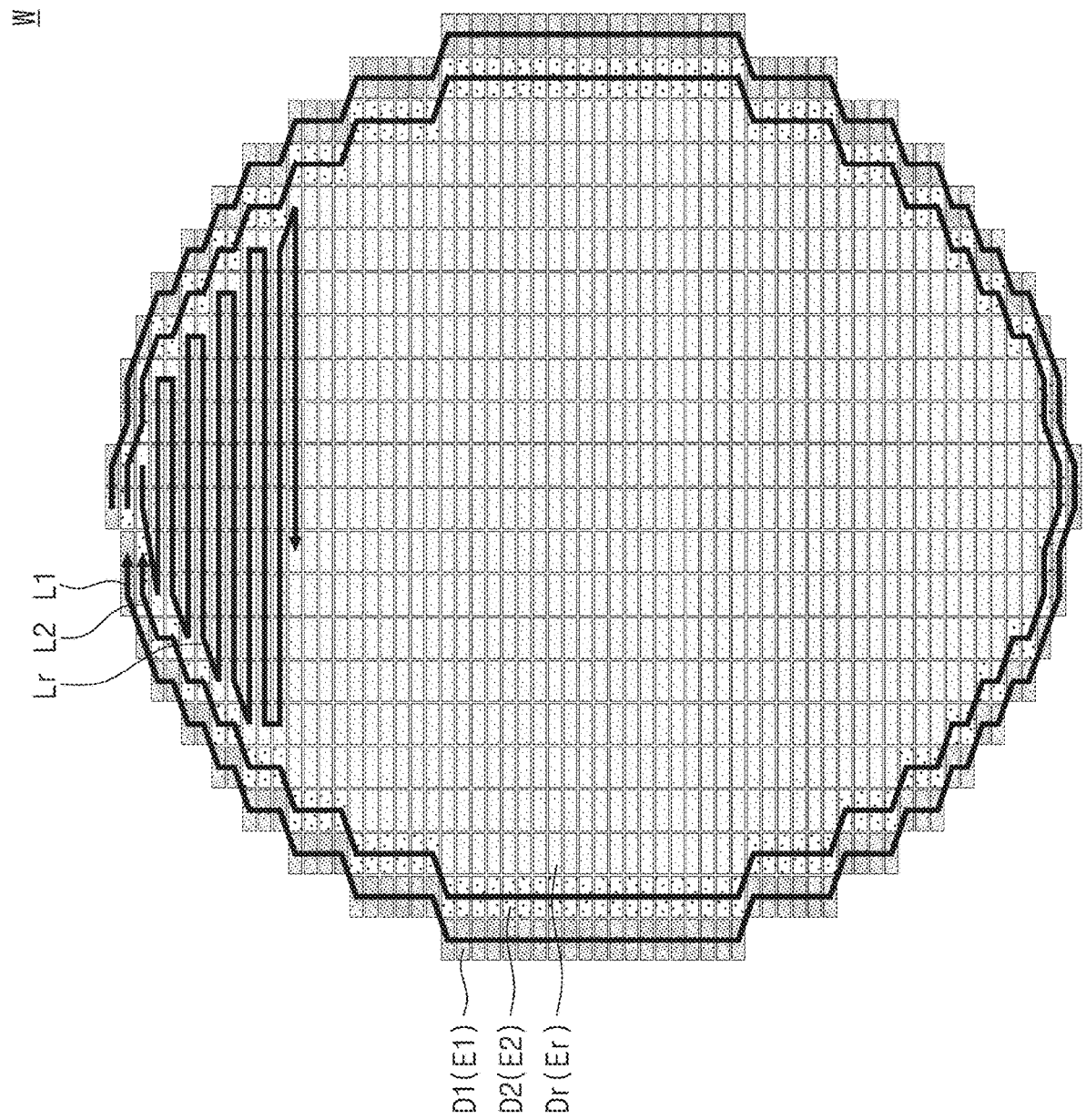

FIGS. 22 and 23 are diagrams sequentially illustrating a process of picking up a die and manufacturing a semiconductor package, according to the flow chart of FIG. 18 according to some example embodiments of the inventive concepts.

Referring to FIGS. 22 and 21, the classifying of the pickup region into the first region, the second region, and the remaining region (in Sb2) may include classifying the pickup region PR (e.g., see FIG. 6) into three regions. For example, the pickup region PR may be classified into the first region E1, the second region E2, and the remaining region Er.

The first region E1 may mean a region provided with the outermost dies of the targeted pickup dies. The outermost die may mean a die which has at least one side that is exposed to the outside of the pickup region PR (e.g., see FIG. 6). In other words, the first region E1 of FIG. 22 may be substantially the same as or similar to the first region E1 described with reference to FIG. 7. A die in the first region E1 may be called the first die D1.

The second region E2 may mean all regions, which are occupied by dies adjacent to at least one of the first dies D1. Furthermore, the second region E2 may be placed inside (e.g., at least partially enclosed by, within the pickup region) the first region E1. Restated, and as shown in at least FIGS. 22 and 23, the second region E2 may be proximate to a center of the pickup region PR, which may be the same as a center of the diced wafer W, in relation to the first region E1. In other words, the second region E2 of FIG. 22 may be substantially the same as or similar to the second region E2 described with reference to FIG. 7. A die in the second region E2 may be called the second die D2.

The remaining region Er may be located inside (e.g., at least partially enclosed by, within the pickup region PR) the second region E2. Restated, and as shown in at least FIGS. 22 and 23, the remaining region Er may be proximate to a center of the pickup region PR, which may be the same as a center of the diced wafer W, in relation to the second region E2. In other words, the second region E2 may be provided to enclose the remaining region Er, when viewed in a plan view. A die in the remaining region Er may be called the remaining die Dr.

Referring to FIGS. 23 and 21, the picking up of the first dies in the first region (in Sb31) may be substantially the same as or similar to the picking up of the first dies in the first region (in Sa31) described with reference to FIGS. 20 and 18.

The picking up of the second dies in the second region (in Sb32) may include picking up a plurality of the second dies D2 one by one. The pickup order in the second region E2 may be given in a manner of sequentially picking up a die that is most adjacent to a picked-up die. Hereinafter, a line, which is drawn to depict the pickup order of the second dies D2 to be sequentially picked up from the second region E2, will be referred to as the second pickup line L2. The second pickup line L2 may have a circular or elliptical shape roughly. The second pickup line L2 may be placed inside the first pickup line L1. So far, the second pickup line L2 has been described to be drawn in the clockwise direction, but the inventive concepts are not limited to this example. In other words, the second pickup line L2 may be drawn in the counterclockwise direction.

The picking up of the inner dies in the remaining region (in Sb33) may include picking up the remaining dies Dr one by one. The pickup order in the remaining region Er may be given along a zigzag trajectory. The picking up of the inner dies in the remaining region (in Sb33) may be substantially the same as or similar to the picking up of the inner dies in the remaining region (in Sa32) described with reference to FIGS. 20 and 18.

Each of the picking up of the first dies in the first region (in Sb31) and the picking up of the second dies in the second region (in Sb32) may not be overlapped with the picking up of the inner dies in the remaining region (in Sb33) in time. More specifically, until the pickup step on one of the groups of the first dies D1, the second dies D2, and the inner dies Dr is completely finished, the pickup step may not be performed on the remaining groups. For example, the pickup step on the first dies D1 and the pickup step on the second dies D2 may not overlap in time (e.g., may not occur concurrently).

For example, in the case where the picking up of the first dies in the first region (in Sb31) and the picking up of the second dies in the second region (in Sb32) are first performed, the picking up of the inner dies in the remaining region (in Sb33) may be performed only after all of the first and second dies D1 and D2 are picked up.

In some example embodiments, in the case where the picking up of the inner dies in the remaining region (in Sb33) is first performed, the picking up of the first dies in the first region (in Sb31) and the picking up of the second dies in the second region (in Sb32) may be performed only after all of the inner dies Dr are picked up.

According to the afore-described die pickup method and the method of manufacturing a semiconductor package using the same, the first and second dies, which are placed in the outermost region having the highest failure rate, may be separately picked up and may be stacked on the substrate. Thus, it may be possible to increase the yield in the process of manufacturing a semiconductor package.

In addition, the remaining dies, which are placed in the remaining region having a relatively low failure rate, may be sequentially picked up along a zigzag trajectory. Accordingly, it may be possible to reduce process time in the pickup process.

According to the afore-described die pickup method and the method of manufacturing a semiconductor package using the same, the pickup step may be first performed along a circular trajectory that is given to span only the first region having an especially high failure rate and the second region having the second highest failure rate, and the pickup step in the remaining region may be performed along a zigzag trajectory. Accordingly, it may be possible to improve the yield in the process of manufacturing a semiconductor package and to prevent the process time from being increased. That is, it may be possible to achieve both of the yield improvement and the shortened process.

Figure 24:
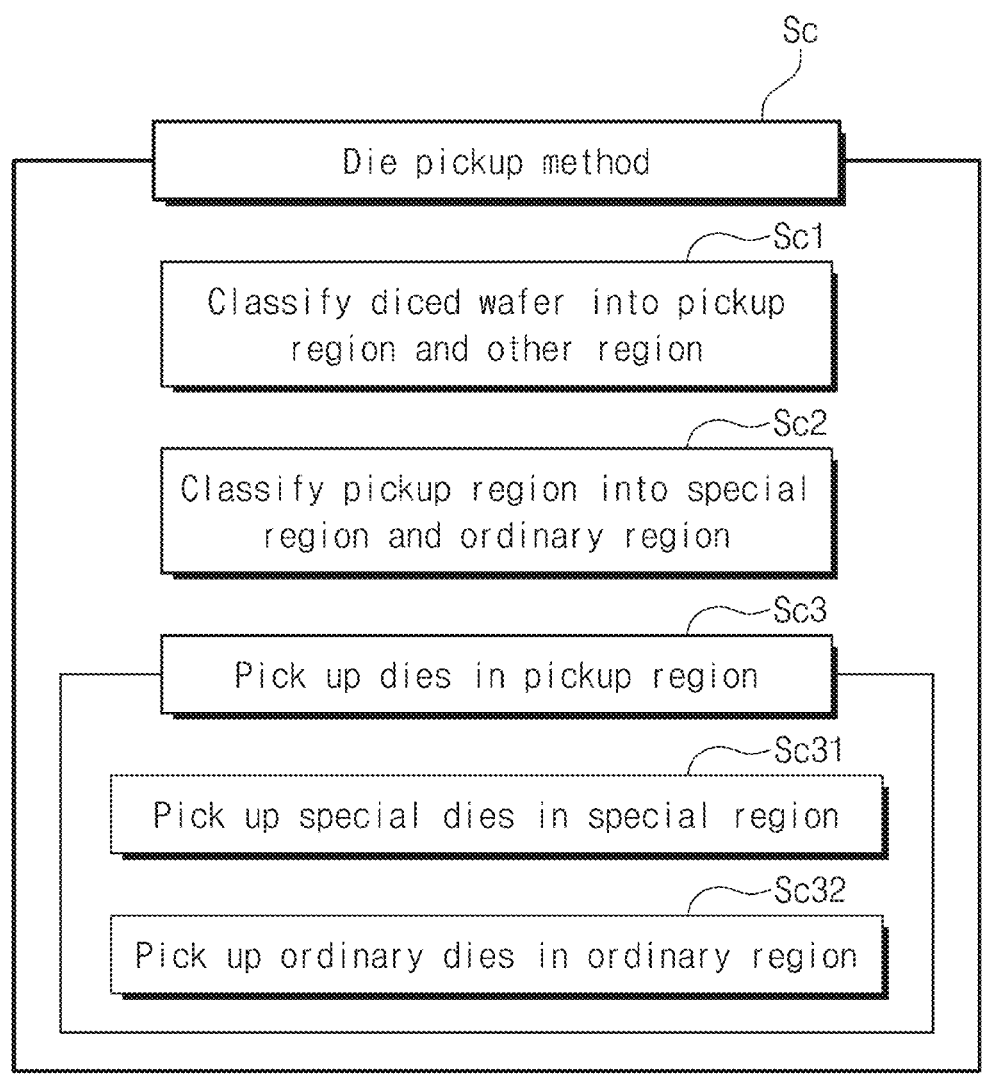
FIG. 24 is a flow chart illustrating a die pickup method which is performed as a part of a method of manufacturing a semiconductor package, according to some example embodiments of the inventive concepts.

FIG. 24 is a flow chart illustrating a die pickup method which is performed as a part of a method of manufacturing a semiconductor package, according to some example embodiments of the inventive concepts.

Hereinafter, for concise description, an element previously described with reference to FIGS. 1 to 23 may be identified by the same reference number without repeating an overlapping description thereof.

Referring to FIG. 24, a die pickup method Sc may be provided. The die pickup method Sc may include classifying a diced wafer into a pickup region and other region (in Sc1), classifying the pickup region into a special region and an ordinary region (in Sc2), and picking up dies in the pickup region (in Sc3). The die pickup method Sc may mean a method which is used to perform the picking up of the die from the diced wafer (in MS4) in FIG. 3A.

The picking up of the dies in the pickup region (in Sc3) may include picking up special dies in the special region (in Sc31) and picking up ordinary dies in the ordinary region (in Sc32).

Hereinafter, the die pickup method according to the flow chart of FIG. 24 and the method of manufacturing a semiconductor package using the same will be described in more detail with reference to FIGS. 25 to 26.

Figure 25:
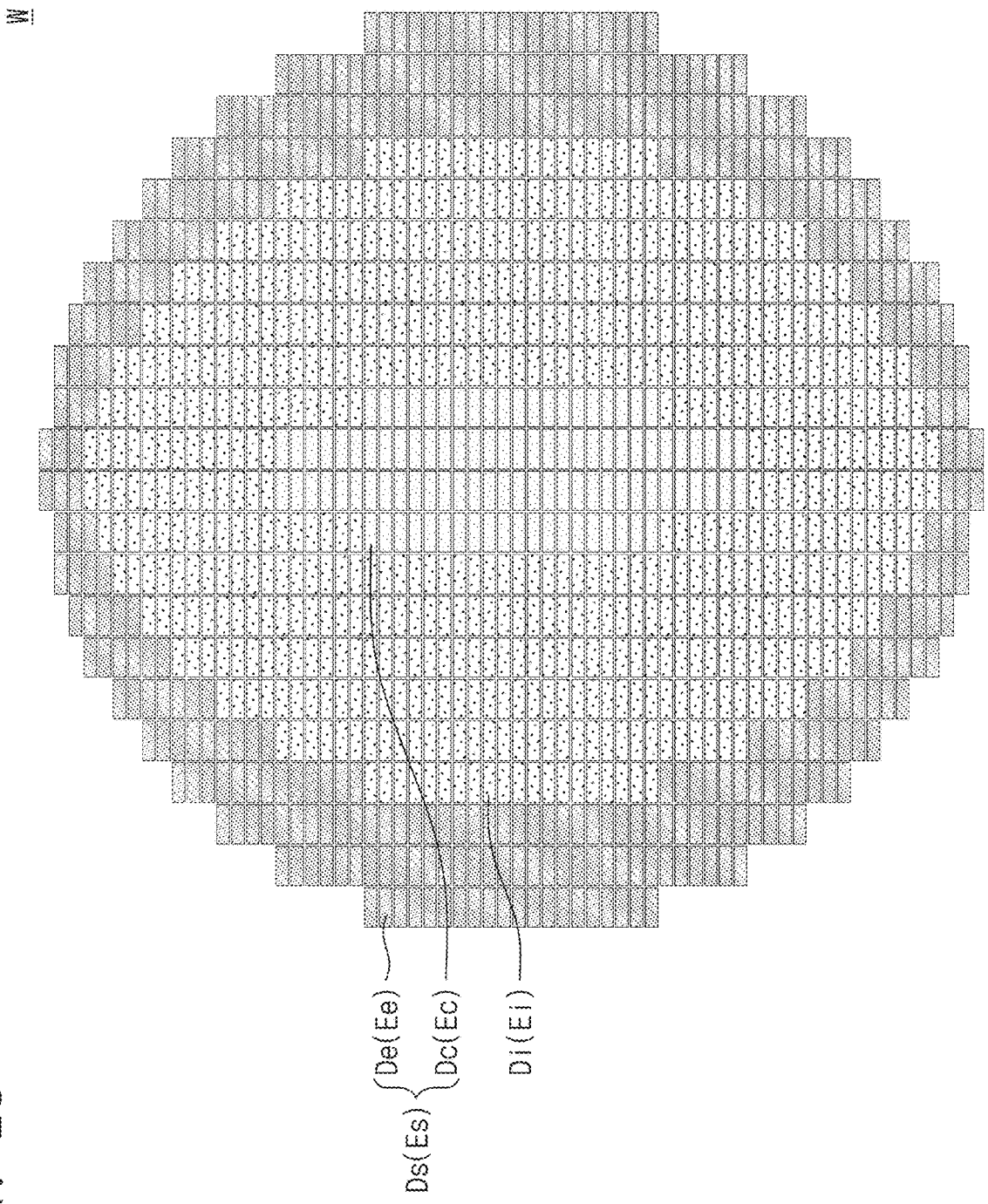
FIGS. 25 and 26 are diagrams sequentially illustrating a process of picking up a die and manufacturing a semiconductor package, according to the flow chart of FIG. 18 according to some example embodiments of the inventive concepts.
Figure 26:
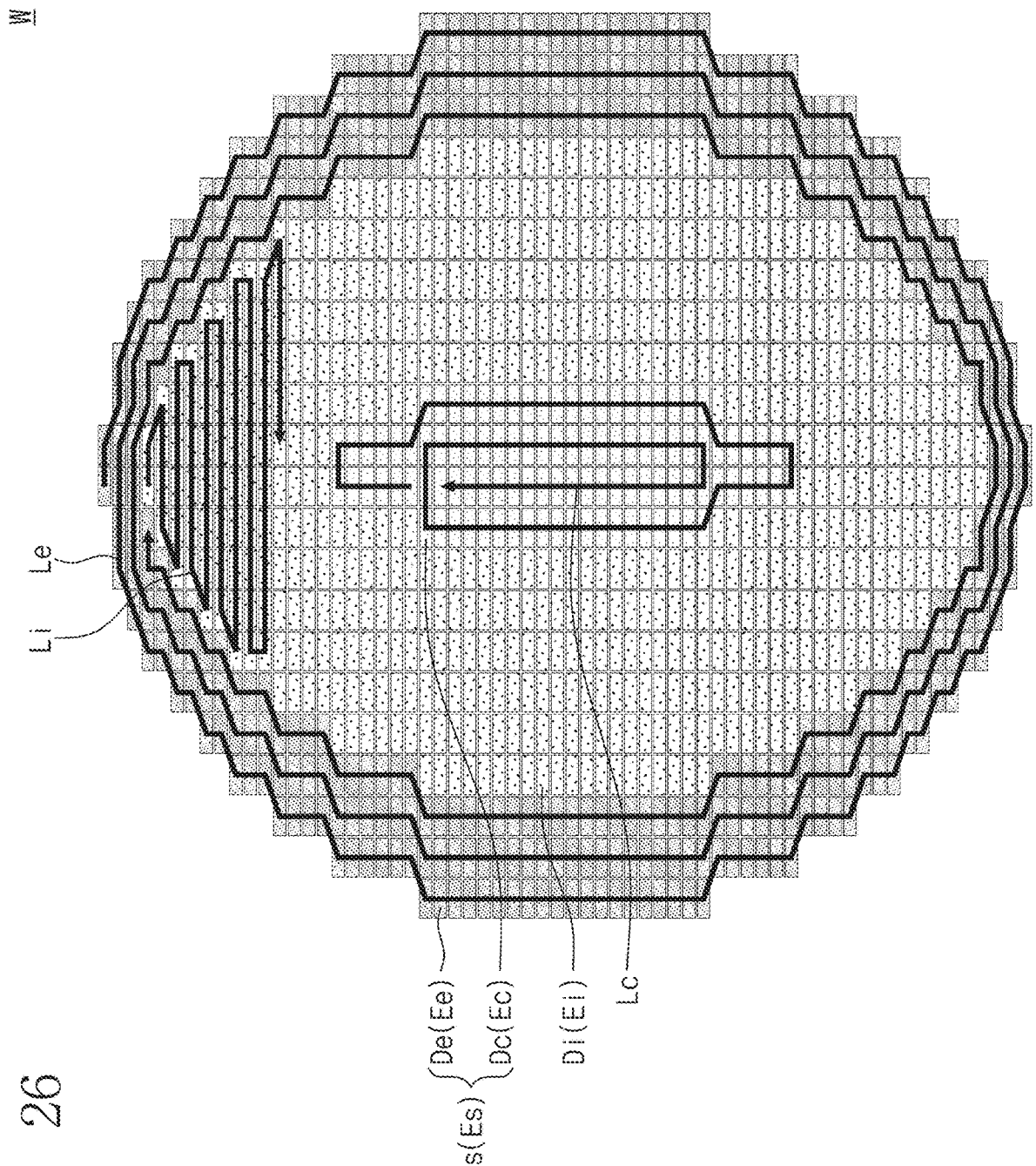

FIGS. 25 and 26 are diagrams sequentially illustrating a process of picking up a die and manufacturing a semiconductor package, according to the flow chart of FIG. 18.

Referring to FIGS. 25 and 24, the classifying of the pickup region into the special region and the ordinary region (in Sc2) may include classifying the pickup region PR (e.g., see FIG. 6) into two regions. For example, the pickup region PR may be classified into a special region Es and an ordinary region Ei.

The special region Es may include an edge region Ee and a center region Ec. A die located in the special region Es may be called a special die Ds. Hereinafter, the special region Es may be called a first region. In addition, the special die Ds may be called a first die.

The edge region Ee may be defined to include a region provided with the outermost dies of the targeted pickup dies. The outermost die may mean a die which has at least one side that is exposed to the outside of the pickup region PR (e.g., see FIG. 6). In other words, the edge region Ee of FIG. 25 may be a region including the first region E1 described with reference to FIG. 7. The edge region Ee may be defined to include only the first region E1 shown in FIG. 7 and thus may be compose of only regions provided with the first dies D1. In some example embodiments, the edge region Ee may be defined to include only the first region E1 and the second region E2 shown in FIG. 7. For example, the edge region Ee may be composed of only a first region E1 provided with the first dies D1, and a second region E2 provided with second dies D2 which are adjacent to at least one of the first dies D1. Where the species region Es is referred to as a "first region" and the ordinary region Ei is referred to as a "second region," the first region E1 and second region E2 that are composed within the edge region Ee may be referred to as a "first edge region" and a "second edge region," respectively. In some example embodiments, the edge region Ee may be defined to include only the first region E1, the second region E2, and the third region E3 shown in FIG. 7. However, the inventive concepts are not limited to this example, and in some example embodiments, the edge region Ee may be defined to include a plurality of regions which are successively provided near the first region E1. A die located in the edge region Ee may be called an edge die De.

The center region Ec may be a region including the center of the wafer W. The center region Ec may be spaced apart from the edge region Ee. In other words, the center region Ec and the edge region Ee may not be in contact with each other. The center region Ec of FIG. 25 may be a region including the n-th region En described with reference to FIG. 7. The center region Ec may be defined to include only the n-th region En shown in FIG. 7. In some example embodiments, the center region Ec may be defined to include only the n-th region En and the (n−1)-th region E(n−1) shown in FIG. 7. However, the inventive concepts are not limited to this example, and in some example embodiments, the center region Ec may be defined to include a region which includes the center of the wafer W and has a shape different from those in the previously-described example embodiments. A die located in the center region Ec may be called a center die Dc.

The ordinary region Ei may be located between the edge region Ee and the center region Ec. In other words, the ordinary region Ei may be provided to enclose the center region Ec, when viewed in a plan view. In addition, the edge region Ee may be provided to enclose the center region Ec, when viewed in a plan view. A die in the ordinary region Ei may be called an ordinary die Di. Hereinafter, the ordinary region Ei may be called a second region. In addition, the ordinary die Di may be called a second die.

Referring to FIGS. 26 and 24, the picking up of the special dies in the special region (in Sc31) may include picking up the edge die De and picking up the center die Dc.

The picking up of the edge die De may include picking up a plurality of the edge dies De one by one. The pickup order in the edge region Ee may be given along a roughly spiral trajectory. Hereinafter, a line, which is drawn to depict the pickup order of the edge dies De to be sequentially picked up from the edge region Ee, will be referred to as an edge pickup line Le. The edge pickup line Le may have a spiral shape roughly. However, the inventive concepts are not limited to this example, and in some example embodiments, the edge pickup line Le may have a shape that is different from the spiral.

The picking up of the center die Dc may include picking up a plurality of the center dies Dc one by one. The pickup order in the center region Ec may be given along a roughly spiral trajectory. Hereinafter, a line, which is drawn to depict the pickup order of the center dies Dc to be sequentially picked up from the center region Ec, will be referred to as a center pickup line Lc. The center pickup line Lc may have a spiral shape roughly. However, the inventive concepts are not limited to this example, and in some example embodiments, the center pickup line Lc may have a shape that is different from the spiral.

The picking up of the ordinary dies in the ordinary region (in Sc32) may include picking up a plurality of the ordinary dies Di one by one. The pickup order in the ordinary region Ei may be given along a zigzag trajectory. Hereinafter, a line, which is drawn to depict the pickup order of the ordinary dies Di to be sequentially picked up from the ordinary region Ei, will be referred to as an ordinary pickup line Li. The ordinary pickup line Li may have a zigzag shape roughly. However, the inventive concepts are not limited to this example, and in some example embodiments, the ordinary pickup line Li may have a shape that is different from the zigzag shape.

The picking up of the special dies in the special region (in Sc31) and the picking up of the ordinary dies in the ordinary region (in Sc32) may not be overlapped with each other in time. More specifically, until the pickup step on one of the groups of the special dies Ds and the ordinary dies Di is completely finished, the pickup step may not be performed on the remaining group of the groups of the special dies Ds and the ordinary dies Di. Restated, the pickup step on the special dies Ds and the pickup step on the ordinary dies Di may not overlap in time (e.g., may not occur concurrently).

For example, in the case where the picking up of the special dies in the special region (in Sc31) is first performed, the picking up of the ordinary dies in the ordinary region (in Sc32) may be performed only after all of the special dies Ds are picked up.

In some example embodiments, in the case where the picking up of the ordinary dies in the ordinary region (in Sc32) is first performed, the picking up of the special dies in the special region (in Sc31) may be performed only after all of the ordinary dies Di are picked up.

According to the afore-described die pickup method and the method of manufacturing a semiconductor package using the same, the edge and center dies, which have the highest failure rate, may be separately picked up and may be stacked on the substrate. Thus, it may be possible to increase the yield in the process of manufacturing a semiconductor package.

In addition, the ordinary dies, which are placed in the ordinary region having a relatively low failure rate, may be sequentially picked up along a zigzag trajectory. Accordingly, it may be possible to reduce process time in the pickup process.

According to the afore-described die pickup method and the method of manufacturing a semiconductor package using the same, the pickup step may be first performed along a circular trajectory that is given to span only the special region having an especially high failure rate, and the pickup step in the ordinary region may be performed along a zigzag trajectory. Accordingly, it may be possible to improve the yield in the process of manufacturing a semiconductor package and to maximally reduce the process time. That is, it may be possible to achieve both of the yield improvement and the reduced process time.

In a method of picking up a die according to some example embodiments of the inventive concepts and a method of manufacturing a semiconductor package using the same, it may be possible to improve a yield in a process of manufacturing a semiconductor package.

In a method of picking up a die according to some example embodiments of the inventive concepts and a method of manufacturing a semiconductor package using the same, a semiconductor package may be manufactured by collectively stacking dies, which are disposed in a region having a high failure rate, on a substrate.

As described herein, any devices, systems, blocks, modules, units, controllers, circuits, and/or portions thereof according to any of the example embodiments (including, without limitation, semiconductor package manufacturing system SA, dicing apparatus DA, transfer apparatus TR, die pickup apparatus DPA, stage ST, die picker P, picker driving part PA, packaging stage PST, and control unit C, any portion thereof, or the like) may include, may be included in, and/or may be implemented by one or more instances of processing circuitry such as hardware including logic circuits; a hardware/software combination such as a processor executing software; or a combination thereof. For example, the processing circuity more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, blocks, modules, units, controllers, circuits, and/or portions thereof according to any of the example embodiments, and/or any portions thereof.

While example embodiments of the inventive concepts have been particularly shown and described, it will be understood by one of ordinary skill in the art that variations in form and detail may be made therein without departing from the spirit and scope of the attached claims.

What is claimed is:

1. A method of picking up a die, the method comprising:
classifying a pickup region of a diced wafer, in which targeted pickup dies are placed, into first to n-th regions; and
performing a pickup step on dies in the first to n-th regions,
wherein the first region is a region provided with first dies, which are outermost dies of the targeted pickup dies,
wherein an (x+1)-th region comprises regions, which are occupied by dies adjacent to at least one die of x-th dies in an x-th region, wherein the (x+1)-th region is proximate to a center of the pickup region in relation to the x-th region,
wherein n is a natural number,
wherein x is an arbitrary natural number that is smaller than n,
wherein the n-th region has a rectangular shape,
wherein among n-th dies in the n-th region, a quantity of the n-th dies in contact with a short side of the n-th region is 1 or 2, and
wherein the performing the pickup step on dies in the first to n-th regions includes performing the pickup step on (x+1)-th dies in the (x+1)-th region subsequently to finishing performing the pickup step on all of the x-th dies in the x-th region.

2. The method of claim 1, wherein the pickup step on the (x+1)-th dies comprises picking up the (x+1)-th dies sequentially in a clockwise direction, when viewed in a plan view.

3. The method of claim 1, wherein the pickup step on the (x+1)-th dies comprises picking up the (x+1)-th dies sequentially in a counterclockwise direction, when viewed in a plan view.

4. The method of claim 1, wherein the (x+1)-th region is composed of only regions which are occupied by dies adjacent to at least one of the x-th dies.

5. The method of claim 1, wherein n is equal to or greater than 8.

6. A method of picking up a die, the method comprising:
classifying a pickup region of a diced wafer, in which targeted pickup dies are placed, into a first region and a remaining region; and
performing a pickup step on dies in the first region and the remaining region one by one,
wherein the first region is a region provided with first dies, each of which has at least one side exposed to an outside of the pickup region,
wherein the remaining region is a region provided with inner dies, wherein the remaining region is proximate to a center of the pickup region in relation to the first region,
wherein the performing the pickup step on the dies in the first region and the remaining region one by one includes
picking up the first dies, and
picking up the inner dies,
wherein the picking up of the inner dies includes sequentially picking up the inner dies one by one along a zigzag trajectory, and wherein, until the pickup step on one group of groups of the first dies and the inner dies is finished, the pickup step is not performed on another group of groups of the first dies and the inner dies.

7. The method of claim 6, wherein the picking up of the first dies is performed after picking up of all of the inner dies is finished.

8. The method of claim 6, wherein the picking up of the inner dies is performed after picking up of all of the first dies is finished.

9. A method of manufacturing a semiconductor package, the method comprising:
classifying a pickup region of a diced wafer, in which targeted pickup dies are placed, into a first region and a second region; and
performing a pickup step on dies in the first region and the second region,
wherein the first region include an edge region and a center region,
wherein the edge region is a region provided with first dies, each of which has at least one side exposed to an outside of the pickup region,
wherein the center region is a region including a center of the diced wafer,
wherein the second region is placed between the edge region and the center region,
wherein the performing the pickup step on the dies includes
picking up first dies in the first region; and
picking up second dies in the second region, and
wherein, until the pickup step on one group of groups of the first dies and the second dies is finished, the pickup step is not performed on another group of groups of the first dies and the second dies.

10. The method of claim 9, wherein the picking up of the second dies is performed after picking up of all of the first dies is finished.

11. The method of claim 9, wherein the picking up of the first dies is performed after picking up of all of the second dies is finished.

12. The method of claim 9, wherein the edge region is composed of only regions provided with the first dies.

13. The method of claim 9, wherein the edge region is composed of only:
a first edge region provided with the first dies; and
a second edge region provided with second dies, which are adjacent to at least one of the first dies.

14. The method of claim 9, further comprising stacking one or more picked-up dies on a first substrate, the one or more picked-up dies being one or more dies that are picked up based on the pickup step.

15. The method of claim 14, further comprising stacking a die, which is picked up after stacking M dies on the first substrate, on a second substrate.

16. The method of claim 9, further comprising:
dicing a wafer into the dies in the first region and the second region to establish the diced wafer, and
performing an expanding step to increase a distance between the dies in the first region and the second region.

* * * * *